(12) United States Patent  
Hass et al.

(10) Patent No.: US 7,718,222 B2
(45) Date of Patent: May 18, 2010

(54) APPARATUS AND METHOD FOR HIGH RATE UNIFORM COATING, INCLUDING NON-LINE OF SIGHT

(75) Inventors: Derek D. Hass, Charlottesville, VA (US); Douglas T. Queheillalt, Charlottesville, VA (US); Haydn N. G. Wadley, Keswick, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1423 days.

(21) Appl. No.: 10/512,161

(22) PCT Filed: Apr. 25, 2003

(86) PCT No.: PCT/US03/12920

§ 371 (c)(1),
(2), (4) Date: Oct. 15, 2004

(87) PCT Pub. No.: WO03/091473

PCT Pub. Date: Nov. 6, 2003

(65) Prior Publication Data

US 2005/0255242 A1  Nov. 17, 2005

Related U.S. Application Data

(60) Provisional application No. 60/375,552, filed on Apr. 25, 2002.

(51) Int. Cl.
*C23C 16/00* (2006.01)
(52) U.S. Cl. ............ 427/248.1; 427/354; 427/574; 427/562; 427/566; 427/540; 427/585; 427/576; 118/723 FI

(58) Field of Classification Search ............ 427/551, 427/248.1, 354, 574, 562, 566, 540, 585, 427/576; 118/723 FI
See application file for complete search history.

(56) References Cited

U.S. PATENT DOCUMENTS 4,629,548 A * 12/1986 Helmer ............... 204/298.19

(Continued)

OTHER PUBLICATIONS

S. Wolf and R.N. Tauber, (Silicon Processing for the VLSI Era, vol. 1- Process Technology, Lattice Press, 1986)(pp. 331-353).*

*Primary Examiner*—Nadine G Norton
*Assistant Examiner*—Mahmoud Dahimene
(74) *Attorney, Agent, or Firm*—Novak Druce DeLuca + Quigg LLP; Robert J. Decker

(57) ABSTRACT

A direct vapor deposition (DVD) apparatus and method is taught, that provides a carrier gas flow entraining vapor atoms for the coating of regions on a substrate that are not in line-of-sight. The degree of non line-of-sight (NLOS) coating, hence thickness uniformity around the substrate is a sensitive function of the flow conditions. For a fixed background pressure in the region of deposition, an increase in the uniformity of the coating thickness is accomplished as the flow velocity is reduced. This improvement in uniformity is a result of an increase in the fraction of vapor atoms which deposit in NLOS positions on the substrate such as backside (21) of fiber (65) as indicated by vapor streamlines (51). Vapor impact width (VIW) is the width of the vapor flux impacting on some area of the fiber. Front side coating (FSC) width is the vapor width of atoms impacting on the substrate frontside (22).

26 Claims, 21 Drawing Sheets

U.S. PATENT DOCUMENTS 5,079,481 A * 1/1992 Moslehi .................. 315/111.41

6,210,744 B1 * 4/2001 Hayess et al. ................... 427/8

* cited by examiner

KNITTING 82

BRAIDING 83

QUASI-TRIAXIAL WEAVE 86

| DIMENSION \ AXIS | 0 NON-AXIAL | 1 MONO-AXIAL | 2 BIAXIAL | 3 TRIAXIAL | 4~ MULTI-AXIAL |
|---|---|---|---|---|---|
| 1D | | ROVING-YARN | | | |
| 2D | CHOPPED STRAND MAT | PREIMPREG-NATION SHEET | PLANE WEAVE 85 | TRIAXIAL WEAVE 84 | MULTI-AXIAL WEAVE, KNIT |
| 3D LINEAR ELEMENT | | 3D BRAID 87 | MULTI-PLY WEAVE 88 | TRIAXIAL 3-D WEAVE 89 | (MULTI-AXIAL 3-D WEAVE) 4)~n, 12)~14) 76 |
| 3D PLANE ELEMENT | | LAMINATE TYPE | H OR I BEAM 77 | HONEY-COMB TYPE 78 | |

FIG. 14E

APPARATUS AND METHOD FOR HIGH RATE UNIFORM COATING, INCLUDING NON-LINE OF SIGHT

CROSS-REFERENCES TO RELATED APPLICATIONS

This application is a national stage filing of International Application No. PCT/US03/12920, filed on Apr. 25, 2003, which claims benefit under 35 U.S.C Section 119(e) from U.S. Provisional Application Ser. No. 60/375,552, filed Apr. 25, 2002, entitled "Apparatus and Method for Uniformly Coating onto Ligament Shaped Structures at High Rate," the entire disclosures of which are hereby incorporated by reference herein in their entirety.

US GOVERNMENT RIGHTS

This invention was made with United States Government support under Grant No. N00014-00-1-0342, awarded by the Defense Advanced Research Projects Agency/Office of Naval Research. The United States Government has certain rights in the invention.

FIELD OF THE INVENTION

The present invention provides a method and an apparatus for efficiently applying a coating to a surface using a directed vapor deposition (DVD) approach, and more particularly applying a coating to the line of sight region as well as non-line of sight regions of the substrate at a high rate.

BACKGROUND OF THE INVENTION

The application of a coating to a substrate is required in a wide variety of engineering applications, including thermal or environmental protection, improved wear resistance, altered optical or electronic properties, decorative, biocompatibility, etc. In each of these cases, the ability to deposit compositionally controlled coatings efficiently, uniformly, at a high rate, with a high part throughput, and in a cost effective manner is highly desired. Electron beam-physical vapor deposition (EB-PVD) is a widely used method for the high-rate production of atomic and molecular vapor (metal or ceramic) for vapor deposition of a coating. During EB-PVD, vapor is transported to a substrate under high vacuum ($10^{-4}$-$10^{-8}$ Torr) conditions where it condenses on surfaces that are in the line-of-sight of the vapor flux source. This requires the use of complicated translation and rotation systems to deposit a uniform and conformal (non line of sight) coating onto ligament shaped structures.

Electron beam-physical vapor deposition (EB-PVD) of metal and ceramic coatings can be quite costly to apply due to high equipment cost, low deposition efficiencies and relatively low deposition rates. The high equipment costs of EB-PVD are a result of the high vacuum environment, which is necessary during deposition (typically below $10^{-6}$ Torr), the high cost of high power electron beam guns and the sophisticated component manipulation systems needed to achieve uniform and conformal (non line-of-sight) coating on non-planar substrates. The operating pressure defines the vacuum pump requirements with lower pressures generally needing more expensive pumps. The low deposition rate and low materials utilization efficiency (MUE) of EB-PVD is related to the distribution of vapor flux as it leaves the evaporated source. Generally, the vapor flux spreads out from the source with a distribution described by a $\cos^n \theta$ function (where n=2, 3, 4 or more). When relatively long source to substrate distances are required the deposition efficiency is dramatically reduced.

As stated above, the ability to uniformly deposit ceramic or metallic coatings onto structural fibers and wires (10 to 1000 µm in diameter) is desirable for a number of applications. They include the deposition of metal on fibers to create metal matrix composites [1-5], deposition of coatings having low shear resistance and good thermochemical stability on the fibers used in ceramic matrix composites [6-11] and the deposition of metals on sacrificial fiber templates to create hollow fibers [12,13]. More generally, vapor deposition approaches which allow the creation of conformal coatings on a variety of non-planar substrates is also of interest. For example, the deposition of reaction inhibiting coatings into the vias and trenches used for microelectronics [14], the growth of coatings on the ligaments of stochastic foam structures [15] and various coatings on medical stents [16, 17] are all growing in importance.

Several options for creating coatings of this type exist. These include chemical vapor deposition (CVD) [1,18], electroplating processes [7,18] and physical vapor deposition (PVD) approaches (such as electron beam evaporation [19] or inverted cylindrical magnatron sputtering [20]). However, despite the many needs, the advancement of processing approaches for these applications above are limited by several factors. Namely, the inability to uniformly coat such substrates without sophisticated substrate translation and rotation capabilities the inability to deposit metal, alloys and ceramics with the same process and low deposition rates which often limit high volume throughputs.

In CVD, uniform coating thicknesses are readily produced in some cases. However, the deposition rates can be low and the process often requires the use of toxic (and expensive) precursor materials [18]. The deposition of multicomponent alloys can also be challenging. Electroplating can provide uniform coating over the surface of complex shaped parts. Although useful for depositing elemental layers, this process is less suitable for the creation of alloy or ceramic coatings [18].

In PVD approaches vapor atoms are created in high vacuum and deposited onto a substrate. One method to created vapor atoms is sputtering. A wide variety of materials can be deposited, but deposition rates are low [3]. The high vacuums employed in these techniques result in few collisions with the background gas resulting in "line-of-sight" coating. Thus, substrate manipulation is required to achieve coating uniformity. Higher deposition rates require more energetic/ higher density plasma sputtering (e.g. magnatrons). But even here rates are only about 0.3 µm/minute.

Atomic vapor can be more rapidly created using electron beam evaporation approaches. However, the materials utilization efficiency (MUE) of electron beam physical vapor deposition is often low (especially for the case of very small substrates such as fibers or wires). This is due to the vapor spreading out from the source with a flux distribution described by a $\cos^n \theta$ function (where n=2-4 or more) [21]. When a relatively long source to substrate distances is required, the deposition efficiency can be low and the deposition rate limited. The high vacuum environments required for the creation of electron beam (approximately $10^{-4}$ Pa) also lead to line of sight (LOS) coating.

Low deposition efficiencies result from flux spreading beyond the periphery of the substrate (which is exacerbated by small ligament shaped substrates) and non line-of-sight deposition. One approach to reduce the spread of the flux exploits entrainment of the vapor on a controllable inert (e.g.

helium or argon) carrier gas flow. Such an approach is used in electron beam-directed vapor deposition (EB-DVD), details of the EB-DVD process can be found in co-assigned U.S. Pat. No. 5,534,314, issued Jul. 9, 1996, entitled "Directed Vapor Deposition of Electron Beam Evaporant," of which is hereby incorporated by reference herein in its entirety. In this approach, the combination of a continuously operating electron beam gun (modified to function in a low vacuum environment) and an inert carrier gas jet. In this system, the vapor plume is intersected with a rarefied trans- or supersonic inert gas jet, to entrain the evaporated flux in a non-reacting gas flow and transport it to a substrate under low vacuum ($10^{-2}$-$10^{1}$ Torr) conditions. Deposition of the atomistic flux then occurs by gas phase scattering from the streamlines of the flow and is deposited onto the substrate at high rates and with high materials utilization efficiency.

Some illustrative examples of deposition systems and methods are provided in the following applications and patents and are co-assigned to the present assignee and are hereby incorporated by reference herein in their entirety: 1) U.S. Pat. No. 6,478,931, issued Nov. 12, 2002, entitled "Apparatus and Method for Intra-layer Modulation of the Material Deposition and Assist Beam and the Multilayer Structure Produced There from," and corresponding divisional U.S. application Ser. No. 10/246,018, filed Sep. 18, 2002, entitled "Apparatus and Method for Intra-layer Modulation of the Material Deposition and Assist Beam and the Multilayer Structure Produced There from;" and 2) PCT International Application No. PCT/US01/16693, filed May 23, 2001, entitled "Process and Apparatus for the Plasma Activated Deposition in a Vacuum," and corresponding U.S. application Ser. No. 10/297,347, filed Nov. 21, 2002; 3) PCT International Application No. PCT/US02/13639, filed Apr. 30, 2002, entitled "Method and Apparatus for Efficient Application of Substrate Coating;" and 4) PCT International Application No. PCT/US02/28654, filed Sep. 10, 2002, entitled "Method and Apparatus for Application of Metallic Alloy Coatings," and these applications and patents are hereby incorporated by reference herein in their entirety.

SUMMARY OF INVENTION

The present invention comprises a method for applying at least one coating on at least one substrate on at least a non-line of sight region of the substrate comprising the steps of: presenting at least one of the substrates to a chamber; wherein the chamber's down stream pressure, $P_c$, has an operating range from about $10^{-4}$ to about $10^{-3}$ Torr; presenting at least one evaporant source to the chamber; presenting carrier gas streams comprised of gas molecules to the chamber, wherein the carrier gas streams being defined by a pressure ratio that gives the carrier gas molecules a given flow velocity, $v_f$, impinging at least one the evaporant sources with at least one electron energetic beam in the chamber to generate an evaporated vapor flux comprised of evaporant molecules; and deflecting at least a portion of at least one of the generated evaporated vapor fluxes by the carrier gas streams. The evaporant molecules have the given flow velocity, $v_f$, and the evaporated vapor flux at least partially coats at least one of the substrates. The flow velocity, $v_f$, allows the scattering time interval, t, of the evaporant molecules and gas molecules to be less than the time the evaporant molecules are within the mean free path, $\lambda$, in the proximity/vicinity of the non-line of sight region of the substrate to be coated. The scattering time interval, t, being defined as the time between collisions of the evaporant molecules and the carrier gas molecules. The mean free path, $\lambda$, being defined as the path segment between successive collisions between a carrier gas molecule and an evaporant molecule.

In another aspect of the present invention, an apparatus is provided for applying at least one coating on at least one substrate on at least a non-line of sight region of the substrate comprising: a chamber having a down stream pressure, $P_c$, with an operating range from about $10^{-4}$ to about $10^3$ Torr, and wherein at least one of the substrates are presented in the chamber; at least one evaporant source is disposed in the chamber, wherein the carrier gas streams are comprised of gas molecules that are defined by a pressure ratio that gives the carrier gas molecules a given flow velocity, $v_f$, and at least one energetic beam, wherein the energetic beam 1) impinges at least one the evaporant sources in the chamber to generate an evaporated vapor flux comprised of evaporant molecules, and 2) deflects at least a portion of at least one of the generated evaporated vapor fluxes by the carrier gas streams, wherein the evaporant molecules have the given flow velocity, $v_f$, and the evaporated vapor flux at least partially coats at least one the substrates. The flow velocity, $v_f$, allows the scattering time interval, t, of the evaporant molecules and gas molecules to be less than the time the evaporant molecules are within the mean free path, $\lambda$, in the proximity/vicinity of the non-line of sight region of the substrate to be coated. The scattering time interval, t, being defined as the time between collisions of the evaporant molecules and the carrier gas molecules. The mean free path, $\lambda$, being defined as the path segment between successive collisions between a carrier gas molecule and an evaporant molecule.

Additional aspects of the present invention the substrate that is formed using the related methods and apparatuses discussed throughout this document. Such substrates may have a variety of single or multilayer coatings covering the NLOS and/or LOS regions. The substrates may be a variety of desired structures, objects, and surfaces.

BRIEF DESCRIPTION OF THE DRAWINGS

The foregoing and other objects, features and advantages of the present invention, as well as the invention itself, will be more fully understood from the following description of preferred embodiments, when read together with the accompanying drawings in which:

FIGS. 14(A)-(E) show a schematic representation of some non-limiting examples of cellular structures for a core defining the substrate/object.

DETAILED DESCRIPTION OF THE INVENTION

Figure 1:
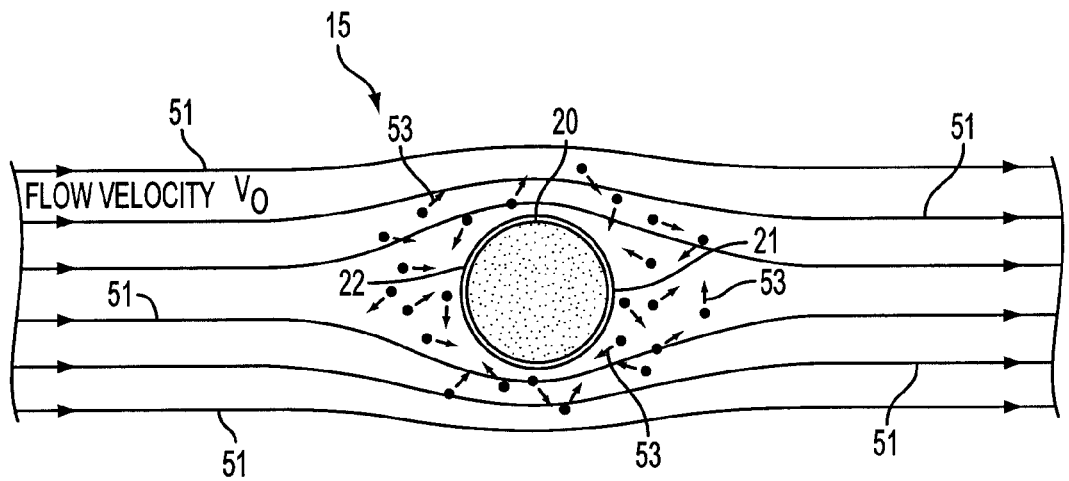
FIG. 1 is schematic illustration of binary scattering of atomic vapor flowing around an object.

The present invention provides a method and apparatus for applying coatings on an object at both line of sight regions as well as non-line of sight regions thereof. As shown in FIG. 1, when the gas jet intersects an object 20, the streamlines 51 pass around the object 20. Scattering (as indicated by the arrows 53) of the condensable vapor flux 15 from this flow then enables non line-of-sight deposition on the non-line of sight region 21, as shown in FIG. 1. The degree to which blind surfaces (i.e., non-line of sight region 21) can be coated is a complicated function of the objects shape, the flow field near it, the composition of the flow, and the collision cross section of the material to be deposited. The two primary factors concerning non line-of-sight deposition are the flow velocity, $v_f$, and the downstream pressure, $P_c$ (i.e., background pressure or chamber pressure). The flow velocity, $v_f$, controls the mean residence time of an atom in the vicinity or proximity of the object to be coated, whereas the background pressure, $P_c$, controls the mean free path, $\lambda$, or said differently, the local number density of atoms in the vapor. The gas upstream pressure, $P_u$, (i.e., upstream pressure of at least one nozzle gas inlet nozzle flow pressure), the operating chamber pressure, $P_c$, and the nozzle geometry dictate both flow velocity, $v_f$ and background pressure.

As will be illustrated infra, the carrier gas stream is created by a rarefied, inert gas supersonic expansion through a nozzle. The speed and flux of the gas atoms entering the chamber, the nozzle parameters, and the operating chamber pressure can all be varied leading to a wide range of processing conditions. Critical to the process is the supersonic carrier gas stream, which is maintained by achieving a high upstream pressure (i.e. the gas pressure prior to its entrance into the processing chamber), $P_u$, and a lower downstream pressure (or chamber pressure), $P_c$. The ratio of the upstream pressure to downstream pressure along with the size and shape of the nozzle opening controls the speed of the gas entering the chamber. The carrier gas molecular weight (compared to that of the vapor) and the carrier gas speed controls its effectiveness in redirecting the vapor atoms via binary collisions towards the substrate. High molecular weight carrier gases are preferred but they have a high electron scattering cross section. Helium is therefore used for entrainment in a preferred embodiment. High speeds are thus required to focus the vapor toward the substrate with a minimal amount of gas flow. High gas speeds also facilitate the formation of a wall jet (i.e. a component of the gas speed generally aligned parallel to the substrate surface) through the interaction of the carrier gas jet with the substrate.

The maximum carrier gas speed by a gas expansion through a nozzle can be estimated from the one-dimensional equations (1) and (2) below for the isentropic (constant entropy) flow of a compressible fluid:

$$\frac{P_u}{P_c} = \left[1 + \frac{\gamma-1}{2}M\right]^{\frac{\gamma}{(\gamma-1)}} \quad (1)$$

$$U = M\sqrt{\gamma R_s T} \quad (2)$$

where $P_u$ is the upstream nozzle pressure, $P_c$ is the downstream chamber pressure, g is the ratio of specific heats (5/3 for helium and argon), M is the flow's Mach number (i.e., the ratio of its velocity to that of the speed of sound), U is the carrier gas stream speed (m/s), T is the absolute temperature (K), and $R_s$ is the specific gas constant (2077 J/kg K for He and 208.1 J/kgK for Ar).

Figure 2A:
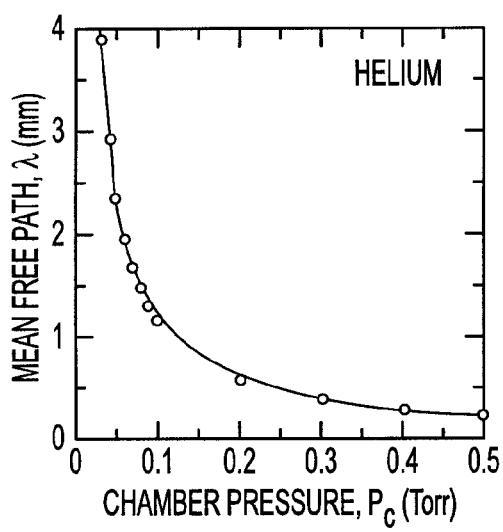
FIGS. 2(A)-(B) are graphical illustrations showing the change in carrier gas atom/vapor species mean free path as the chamber pressure, $P_c$, is altered for helium and argon, respectively.
Figure 2B:
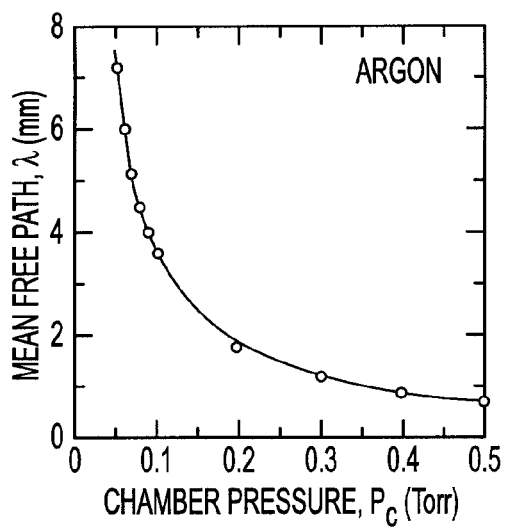

Next, the carrier gas atom/vapor species mean free path (i.e. the distance between vapor/carrier gas atom collision events) can be estimated using the following relationship of equation (3) below:

$$\lambda = \frac{1}{1.4142\pi d^2 n} \quad (3)$$

where λ is the mean free path, d is the molecular diameter of the background gas atom and n is the number density (atoms/cm³) of the background gas. For the EB-DVD case a gas mixture consisting of the carrier gas and the vapor species is present, however, for all the DVD deposition conditions the carrier gas (helium) number density is several orders of magnitude greater than that of the vapor species. Note, as graphically shown in FIGS. 2(A)-2(B), the mean free path will be dramatically reduced as the chamber pressure is increased. It should be further noted that the molecular diameter is dependent on the carrier gas speed which varies throughout the flow field as previously discussed.

The present invention provides a method and apparatus for efficiently applying a uniform and (non line-of-sight) coating onto ligament or substantially non-planar shaped structures/surfaces using a directed vapor deposition (DVD) approach. While this document may primarily describe the present invention of applying a uniform and conformal (non line-of-sight) metal coating, the present invention and apparatus has equal or greater utility for the deposition of metal (elemental or multi-component alloys), semiconducting (elemental or compound), ceramic (oxide or non-oxide), multi-layered (e.g. metal-metal, metal-ceramic, ceramic-ceramic) and/or functionally graded coatings on ligament shaped or non-planar shaped structures/surfaces. Some structures/surfaces including but not limited to: single fibers, fiber arrays (woven or non-woven), fiber bundles, wires, wire mesh structures, yarns, monofilaments, mats, microporous sheets/structures/surfaces, open cell reticulated foams, cellular structures (stochastic or periodic), truss structures, metal grids (perforated or punched or expanded), medical devices (stents or implants), engineering and design tools and instruments, and construction tools and instruments, etc.

Figure 13:
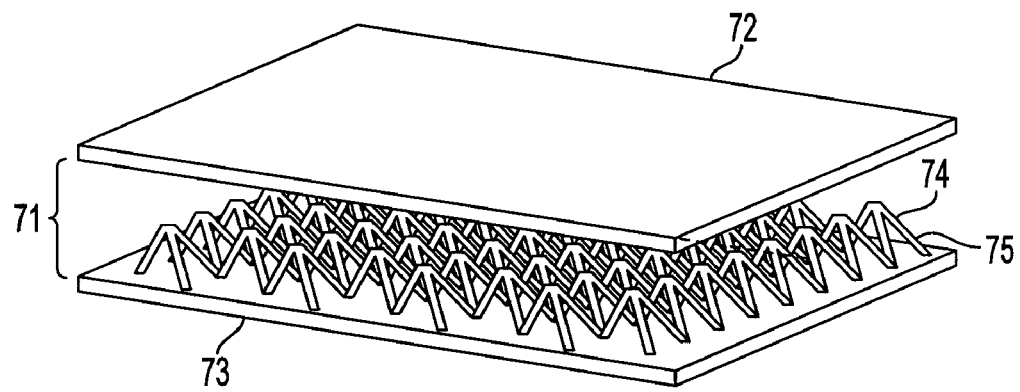
FIG. 13 shows a schematic representation of a non-limiting example of a three-dimensional space-filling array for a core defining the substrate/object.
Figure 14A:
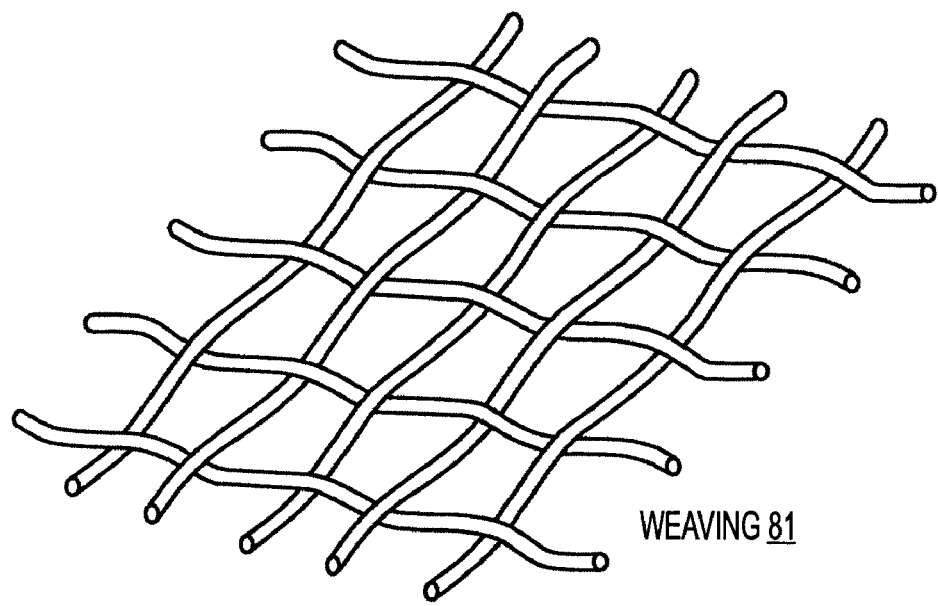
Figure 14B:
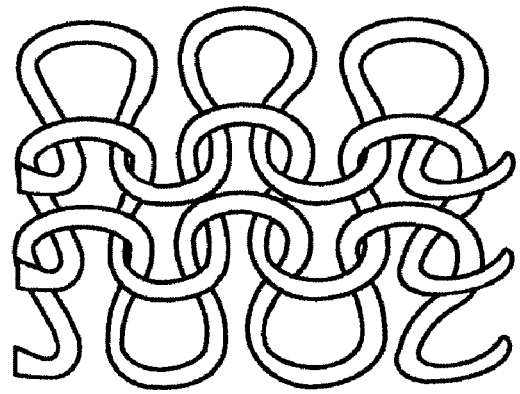
Figure 14C:
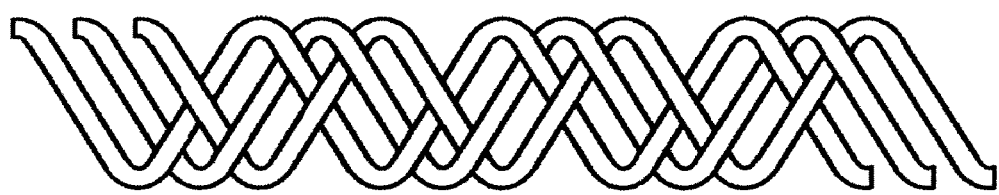
Figure 14D:
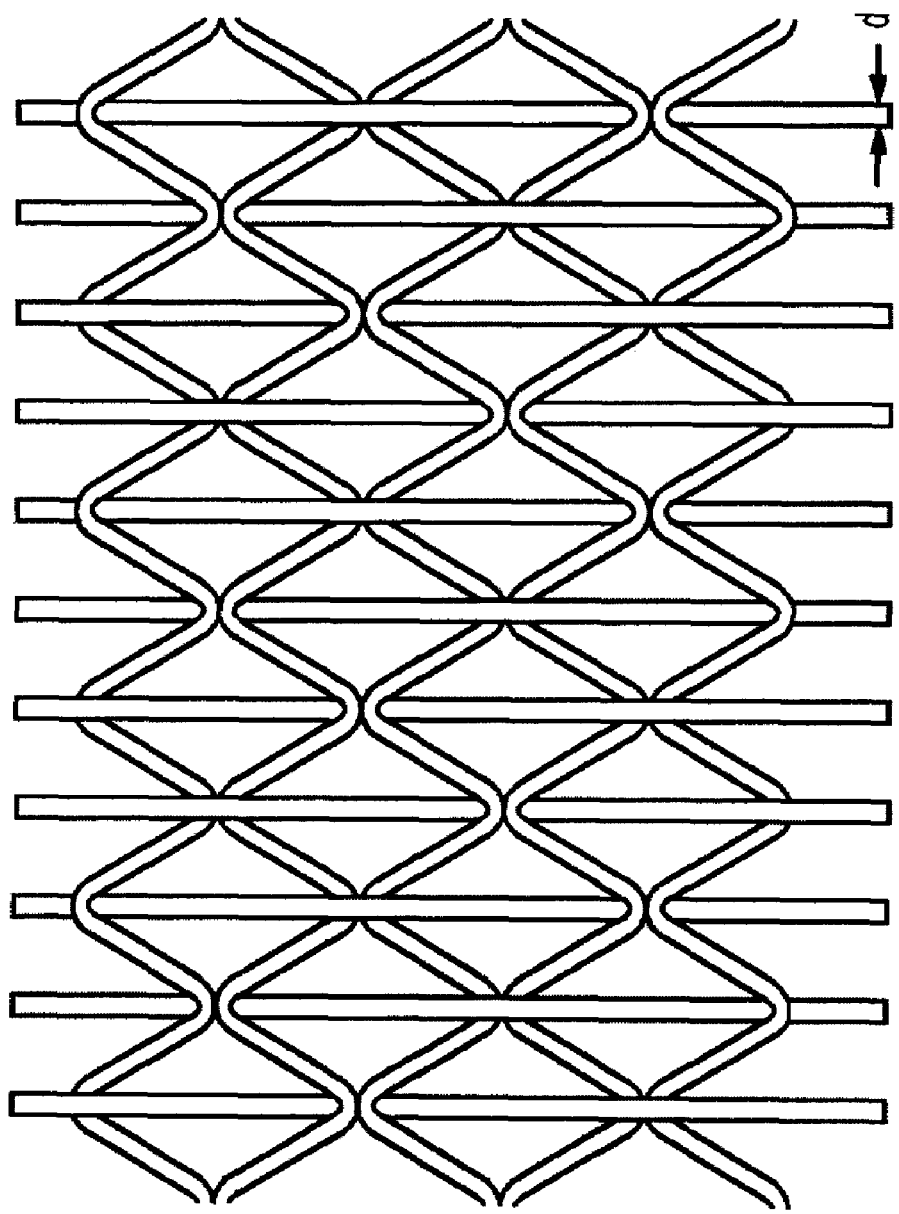
Figure 15:
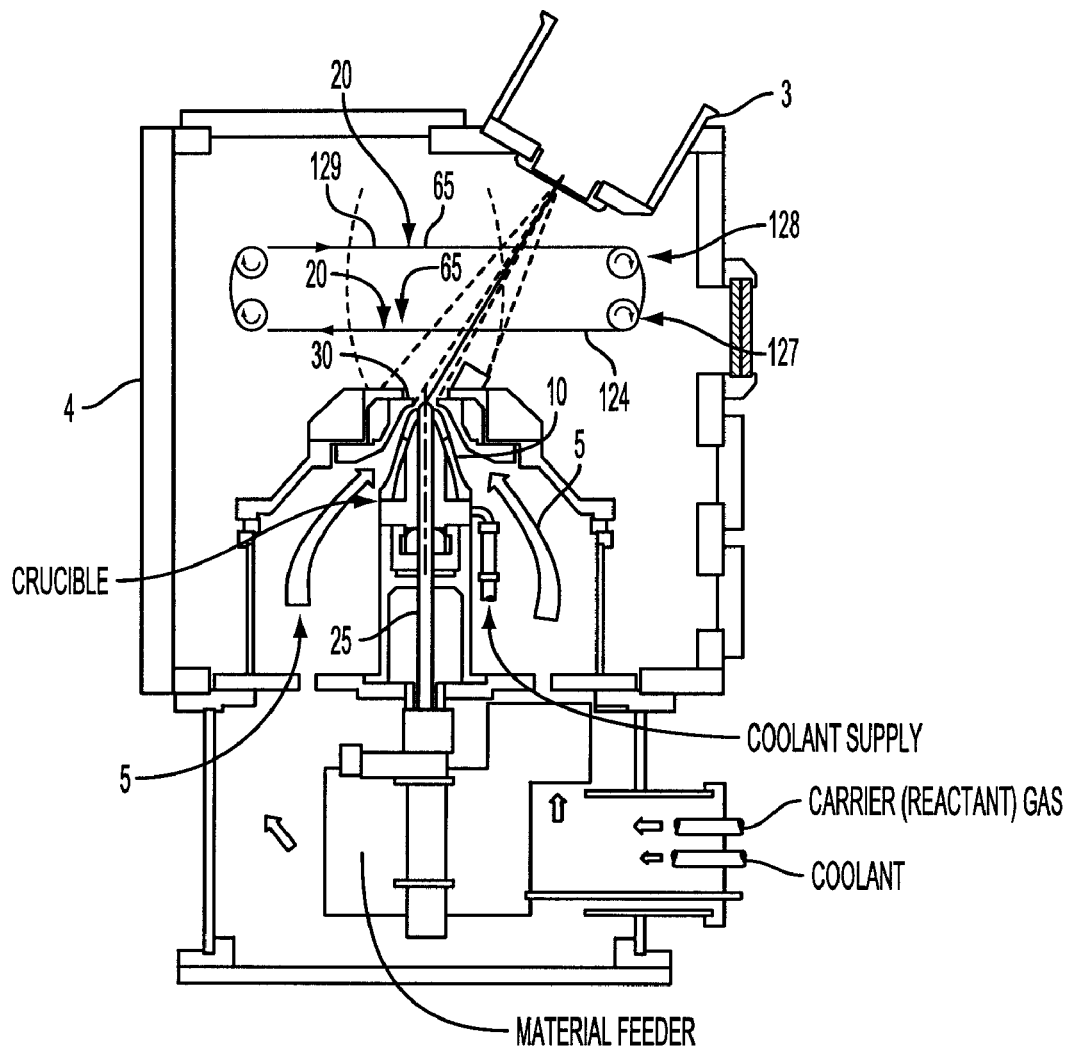
FIG. 15 shows a schematic representation of two-pass system of the directed vapor deposition apparatus for an embodiment of the present invention.
Figure 16B:
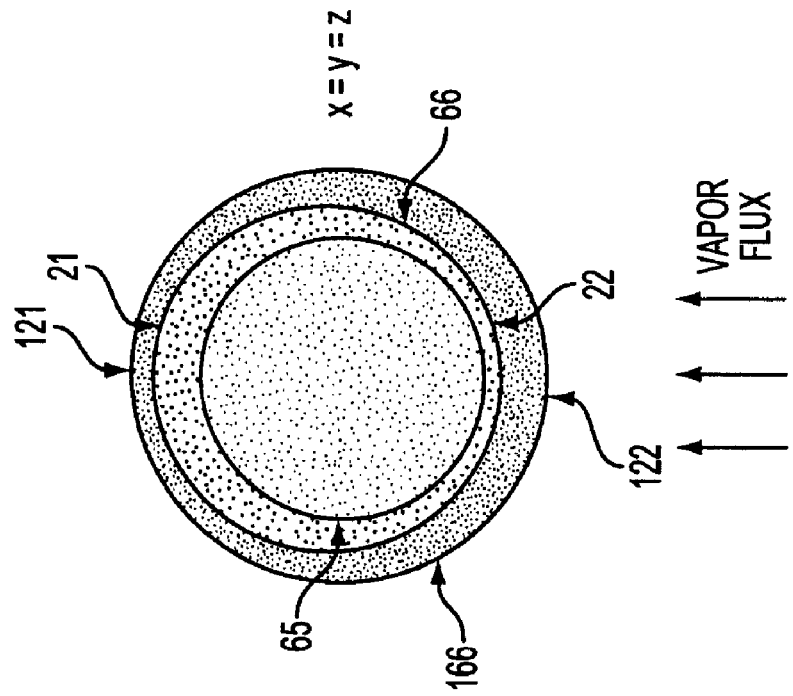
FIGS. 16(A)-(B) schematically illustrate the coating uniformity attained by a the two-pass system using the present invention method and apparatus for applying coatings on an object at both line of sight regions as well as non-line of sight regions thereof for a first pass (FIG. 16(A)) and a second pass (FIG. 16(B)).
Figure 16A:
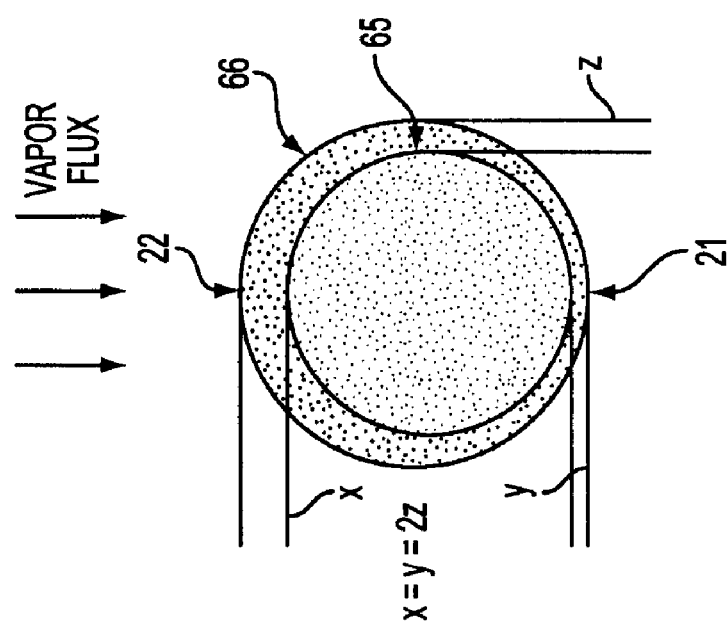

As shown in FIG. 13, according to the design criteria discussed throughout, various substrate designs of the present invention are provided. As shown in co-pending and co-assigned PCT International Application No. PCT/US02/17942, entitled "Multifunctional Periodic Cellular Solids And The Method Of Making Thereof," filed on Jun. 6, 2002, of which is hereby incorporated by reference herein in its entirety, there is provided ways of forming the substrate 20 as a core 71 that is comprised of three-dimensional space filling layers having an array of out-of-plane truss units 74. The out-of-plane truss units 74 may be a variety of shapes including tetrahedral, pyramidal, Kagome, combinations thereof and other non-limiting arrangements. The out-of-plane truss units 74 have hollow or solid leg members 75, for example, but not limited thereto. The core may be affixed to face plates 72, 73.

As shown in FIGS. 14(A)-(E), according to the design criteria discussed throughout, other substrate designs of the present invention are provided. As shown in co-pending and co-assigned PCT International Application No. PCT/US01/17363, entitled "Multifunctional Periodic Cellular Solids And The Method Of Making Thereof," filed on May 29, 2001, and corresponding U.S. application Ser. No. 10/296,728, filed Nov. 25, 2002, of which are hereby incorporated by reference herein in their entirety, there is provided ways of forming the substrate that includes a core that is comprised of textile layers with a center sheet disposed between adjacent said textile layers, however, alternatively, the center sheet may be omitted. In addition to woven textile arrays, various suitable materials may be used. For example, referring to FIGS. 14(A)-(E), there are some non-limiting examples of woven 81, knitted 82, braided 83, triaxial 84, and biaxial 85, pre-crimped quasi-triaxial 86, 3-D braid textile 87, 3-D multi-ply weave 88, 3-D triaxial weave 89, 3-D multi-axial weave 76, 3-D 'H' or 'I' beam 77, 3-D honey-comb type 78 configurations, respectively, that can be used in arrays. Finally, other textile type classifications may be implemented as shown in the schematic views compiled in FIG. 14.

Metals, ceramics, glasses, polymers, composites and even semiconductors can all be utilized for the various core materials, as well as for the other components of the present invention device.

Figure 17B:
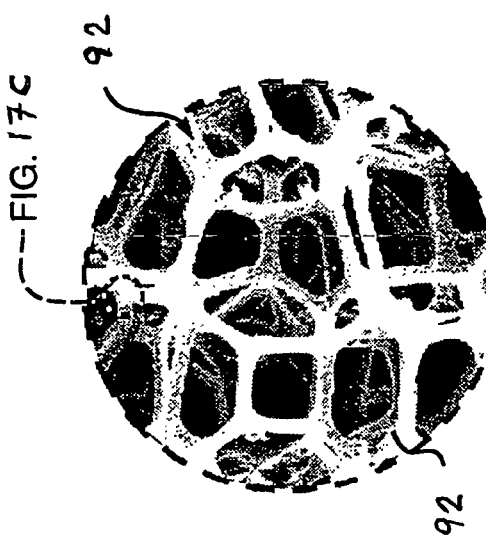
FIG. 17(B) is a micrographic depiction of a magnified partial view of the solid ligament foam shown in FIG. 17(A).
Figure 17C:
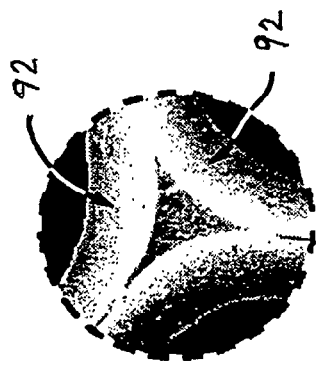
FIG. 17(C) is a micrographic depiction of a magnified partial view of the solid ligaments shown in FIG. 17(B).
Figure 17A:
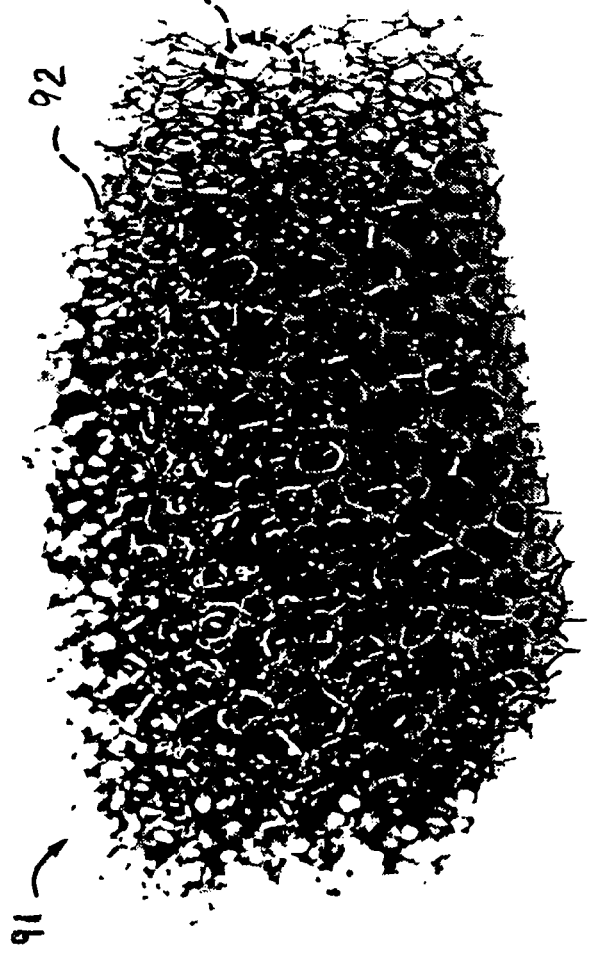
FIG. 17(A) is a photographic depiction of the template foam.

In addition, according to the design criteria discussed throughout, other core designs of the present invention are provided. As shown in co-pending and co-assigned PCT International Application No. PCT/US01/22266, entitled "Heat Exchange Foam," filed on Jul. 16, 2001, and corresponding U.S. application Ser. No. 10/333,004, filed Jan. 14, 2003, of which are hereby incorporated by reference herein in their entirety, there is provided other ways of forming the substrate coatings that includes a core that is comprised of an open cell having solid or hollow ligaments, foam, and/or interconnected network. For example, FIGS. 17(A)-(C), show a foam (template) 91 having solid ligaments 92 comprised of a predetermined material, for example polyurethane, polyester, polyethylene, polyamide, polyvinyl chloride, polypropylene, and polystyrene, or any sacrificial template such as water soluble salt, oxidizable graphite, an easily decomposed polymer, meltable wax or the like. FIG. 17(A) is a photographic depiction of the foam 91, and FIGS. 17(B)-(C), are micrographic depictions of a magnified partial view of the solid ligaments 92 shown in FIG. 17(A). The process of creating a hollow ligament foam utilizing a solid ligament foam 91 is as follows. A preferred method of producing a desirable hollow ligament open cell foam or periodic network structure is to coat a solid ligament open cell foam or network structure (i.e., template) with a coating material, and then evaporate away the solid ligament foam material, leaving a hollow ligament shell.

Figure 18:
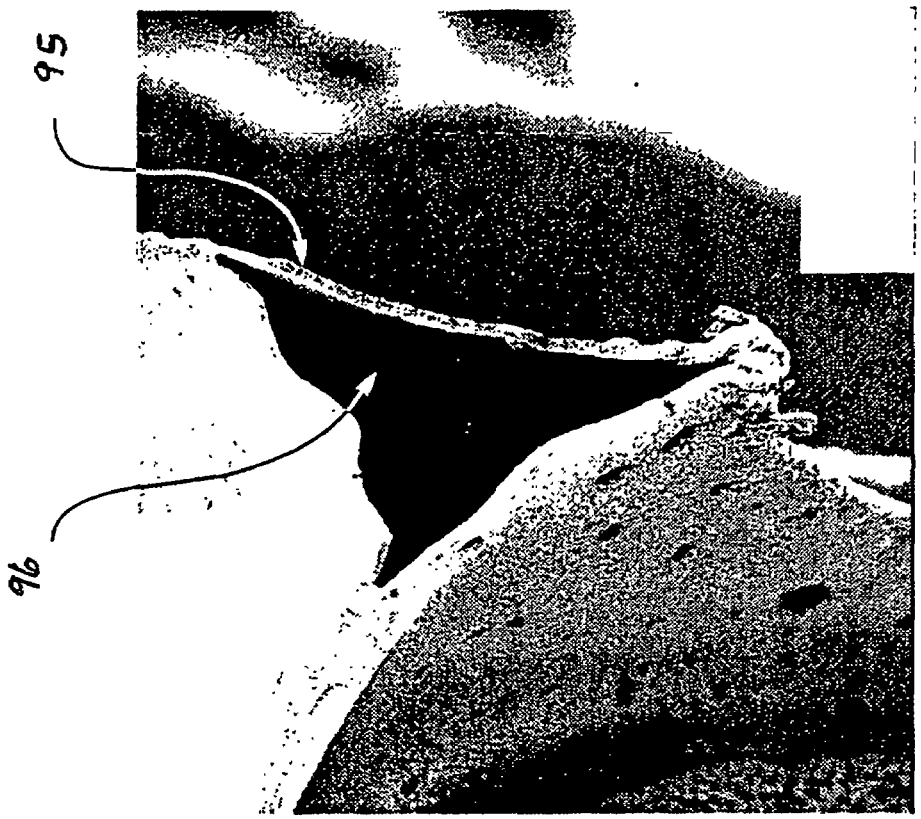
FIGS. 18(A)-(B) show a micrographic depiction of perspective sectional views of an approximately triangular shaped hollow ligament having an internal volume.
Figure 18:
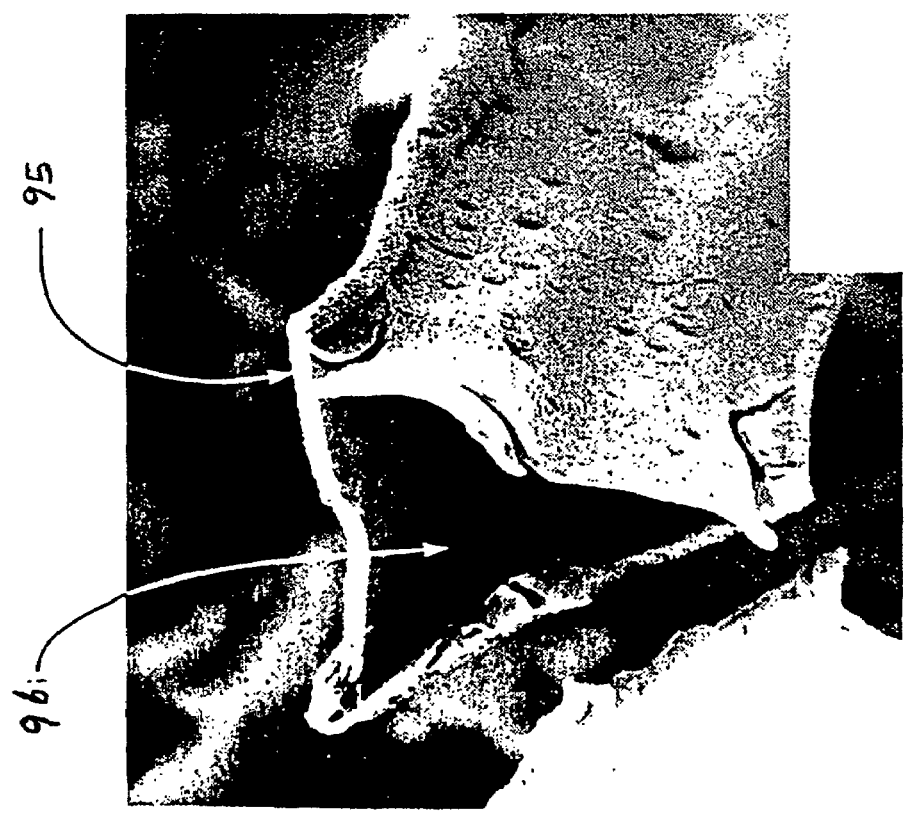

FIGS. 18(A)-(B) show a micrographic depiction of perspective sectional views of an approximately triangular shaped hollow ligament 95 having an internal volume 96, as well as a wall thickness of a predetermined thickness. Other shapes, may include but not limited thereto, cylindrical, oval, triangular, rectangular, or trapezoidal cross section.

Figure 3:
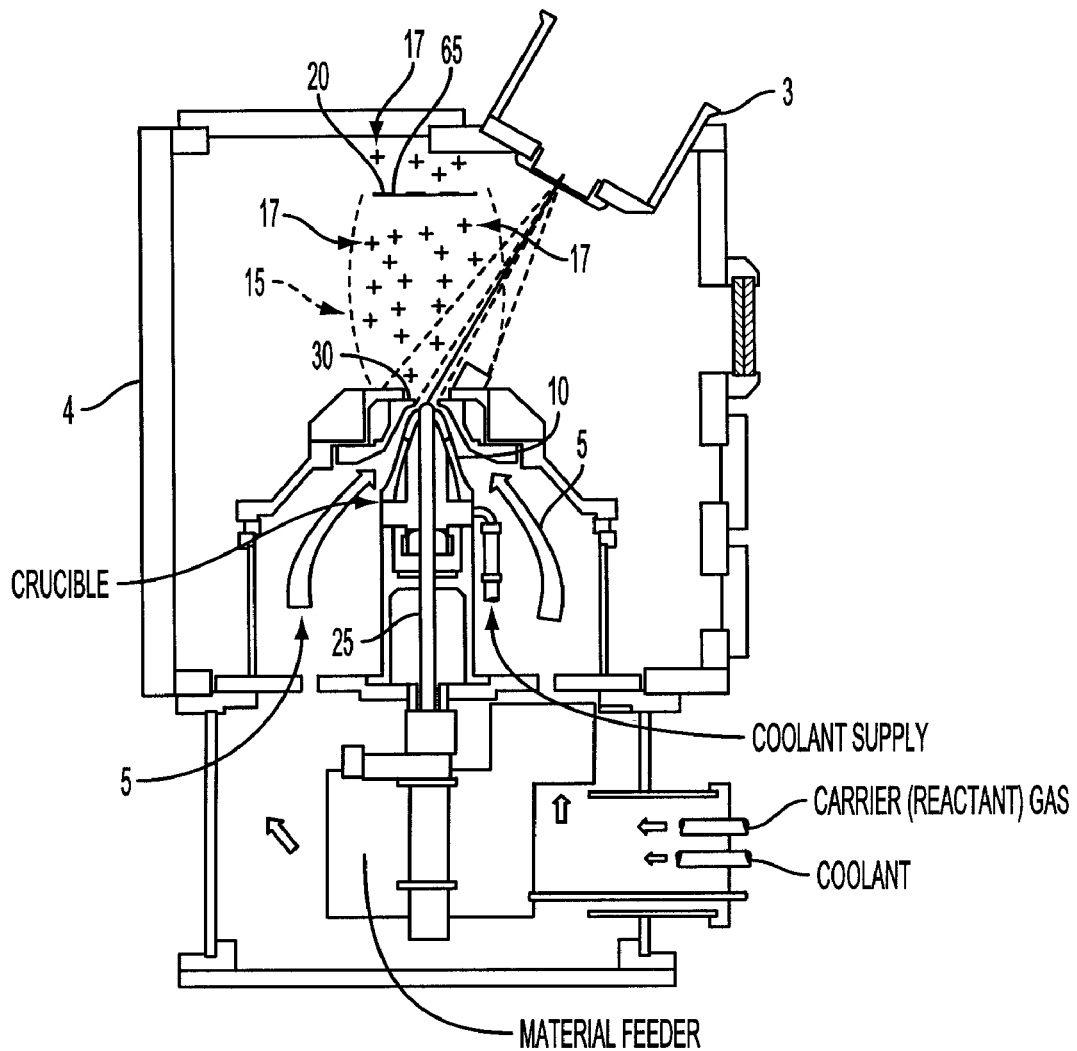
FIG. 3 is a schematic illustration of the directed vapor deposition apparatus for an embodiment of the Example described in this document.
Figure 19B:
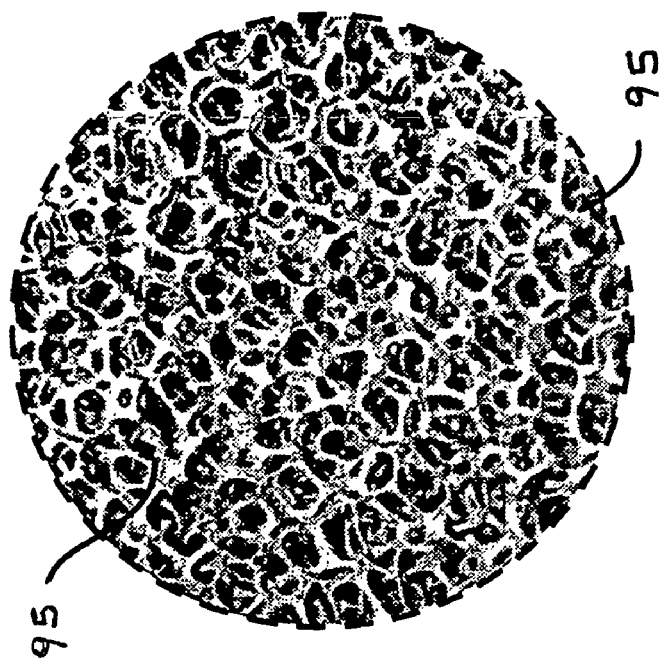
FIG. 19(B) shows a micrographic depiction of a magnified partial view of the various hollow ligaments of FIG. 19(A).
Figure 19A:
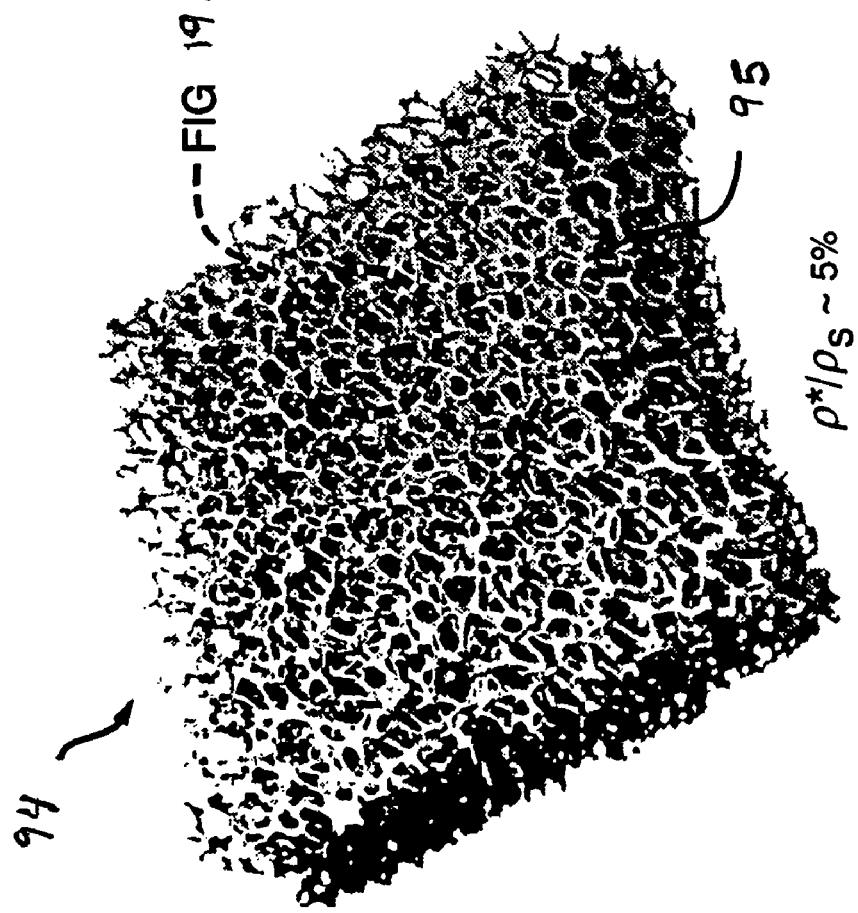
FIG. 19(A) shows a photographic depiction of a perspective view of an open cell hollow foam with hollow ligaments that has been formed using the DVD apparatus.
Figure 20:
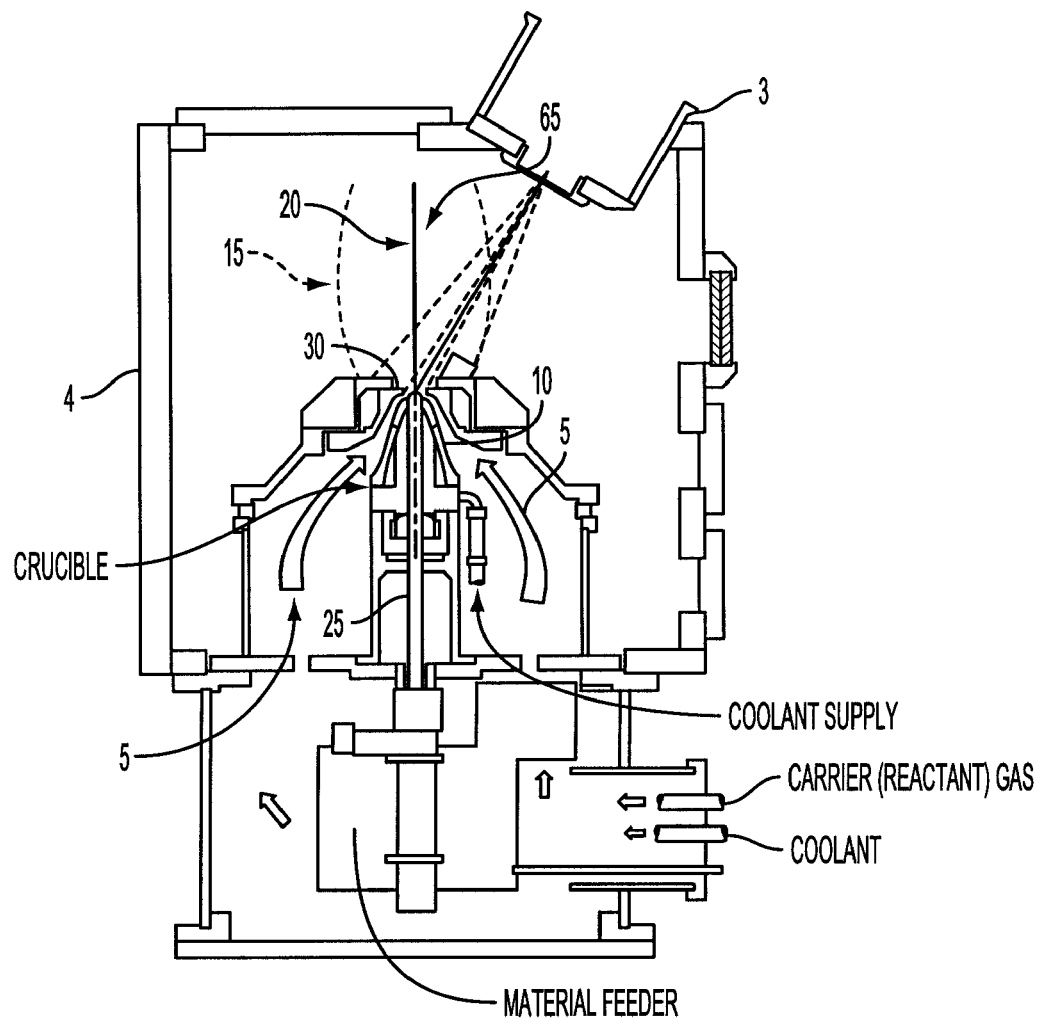
FIG. 20 schematically illustrate the coating uniformity attained by using the present invention method and apparatus for applying coatings on an object whereby the object is at least substantially aligned with the stream lines.

Turning to FIGS. 19(A)-(B), an open cell hollow foam 94 with hollow ligaments 95 that has been formed using the DVD machine and related method thereof, as shown in FIG. 3.

In addition, according to the design criteria discussed throughout, other substrate coating designs of the present invention are provided. As shown in co-assigned PCT International Application No. PCT/US01/25158, entitled "Mulfifunctional Battery and Method of Making the Same," filed on Aug. 10, 2001, and corresponding U.S. application Ser. No. 10/110,368, filed Jul. 22, 2002, of which are hereby incorporated by reference herein in their entirety, there is provided other ways of forming the substrate that includes a core that is comprised of microporous layers. One application, but not limited thereto, is a microporous layer is used as a separators between the anode and cathode of an electromechanical battery. Preferred separator materials may include, but not limited thereto, polymeric film (e.g., polyamide), non-woven polypropylene (e.g., P12 pellon), and microporous polypropylene (e.g., celgard 3401).

The present invention method and apparatus provides the development of processing attributes to deposit uniform and conformal (non line-of-sight) coatings on ligament shaped structures/surfaces. Various configurations of processing attributes of the present invention are described herein and shown to convey the advantages that follow. The advantages of the present invention include, but not limited thereto: improved use of expensive carrier gases, increased deposition efficiency, improved uniformity in the coating. These improvements allow for high rate deposition of ligament shaped structures/surfaces. This results in a dramatically improved method for the efficient application of a uniform and conformal (non line-of-sight) coating on ligament shaped structures/surfaces.

Turning to FIG. 3, FIG. 3 depicts an exemplary embodiment of the present invention apparatus in operation. In the exemplified DVD apparatus 1, material 25 is vaporized using an energetic beam 3 such as a continuous high voltage/medium power (70 kV/10 KW) axial e-beam gun (modified to function in a low vacuum environment by incorporating differential pumping of the gun column and the use of a very small (approximately 3 mm) e-beam exit opening). It should be appreciated that various energetic beams may be utilized in addition to an electron beam, such as a laser source, heat source, ion bombardment source, or highly focused incoherent light source. The vapor flux 15 comprised of, for example, aluminum molecules 17 is focused by a carrier gas 5 and directed into a substrate 20 (i.e., object, target or region thereof). High local vapor densities near the substrate result in a high deposition rate (greater than about 10 μm min$^{-1}$) and with a high materials utilization efficiency [22,23,24]. The carrier gas jet 5 is created by a rarefied, inert gas supersonic expansion through a nozzle 30. This is accomplished by maintaining a high pressure upstream of the nozzle opening, $P_u$, and a lower downstream pressure (or chamber pressure), $P_0$. The pressure ratio, and the size and the shape of the nozzle opening control the speed of the gas entering the chamber. The low vacuum employed in this process results in a short mean-free-path between collisions of vapor and carrier gas atoms. This, combined with the ability to flow the carrier gas over the surface of a complex shaped object sets up the possibility of non-line-of-sight coating (NLOS). It should be appreciated that various kinds of carrier gases may be used, such as but not limited thereto, any one of the following: He, $O_2$, $N_2$, hydrocarbons, silanes, and other inert gases, or various combinations thereof.

It should be noted that source-to-substrate distance is also important for process conditions. The combination of the source-to-substrate distance and the pressure ratio controls the velocity of the gas at the substrate. For example, a pressure ratio of about 10.0 and a distance of about 20 cm would give a similar result as a ratio of about 2.0 and a distance of about 10 cm. This is because the jet velocity decreases with increased distance from the nozzle.

Altering the pressure ratio used to create the carrier gas jet dramatically changes the coating thickness uniformity around the circumference or perimeter of a ligament or cylindrical surface/structure or non-planar structure held stationary and perpendicular to the flow direction. The lowest pressure rations are found to lead to the most uniform coatings.

In operation, the present invention apparatus and method provides a carrier gas flow that entrains vapor atoms that are allowed for the coating of regions on a substrate that are not in line-of-sight. The degree of non line-of-sight coating and thus, the thickness uniformity around the substrate is a sensitive function of the flow conditions. For a fixed background pressure in the region of deposition, an increase in the uniformity of the coating thickness is accomplished as the flow velocity is reduced. This improvement in uniformity is a result of an increase in the fraction of vapor atoms which deposit in NLOS positions on the substrate.

Practice of the invention will be still more fully understood from the following examples, which are presented herein for illustration only and should not be construed as limiting the invention in any way.

Example No. 1

Still referring to FIG. 3, aluminum coatings were produced using a DVD approach with the DVD apparatus 1 having a chamber 4. Aluminum vapor 15 was created by electron beam evaporation from a 0.127 cm diameter aluminum source rod (purity four 9's) 25 (or other material as desired) and deposited on a 380 μm diameter stainless steel fiber 65 as the substrate 20. A 13 cm long wire/fiber was positioned 15.0 cm from the nozzle 30. The midsection of the fiber was located directly above the center of the vapor source 25. The chamber pressure was 16 Pa. Coatings were produced with a pressure ratio of 7.0, 4.5 and 2.0. The aluminum was evaporated at a rate of 67, 58 and 53 mg/min. for three pressure ratios respectively. Evaporation was allowed to continue until the desired thickness (20 to 100 μm) was achieved. The deposition rate varied from 2 to 30 μm/min. on the front side 22 (line of sight side or region) of the fibers (i.e. the side faced the evaporation source) and 0.2 and 2 μm/min. on the backside 21 non-line of sight side or region) of the fibers (i.e. the side faced away from the evaporation source).

Figure 4A:
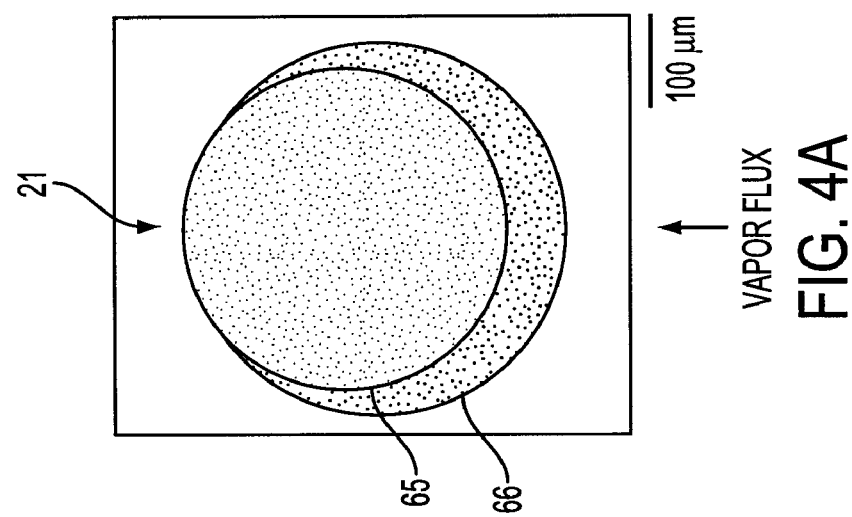
FIGS. 4(A)-(C) are SEM micrograph representations showing the cross section of aluminum coatings deposited onto stainless steel fiber substrates (380 μm diameter) for a pressure ratio of 7.0, 4.5, and 2.0, respectively.
Figure 4B:
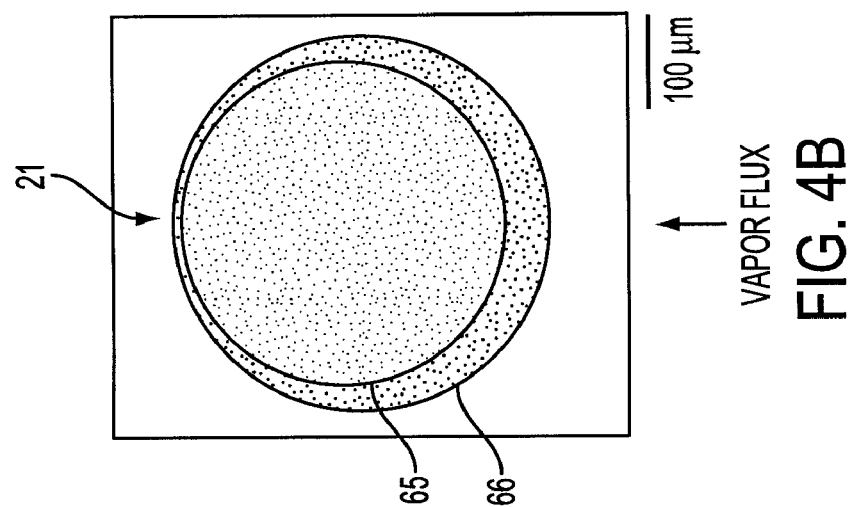
Figure 4C:
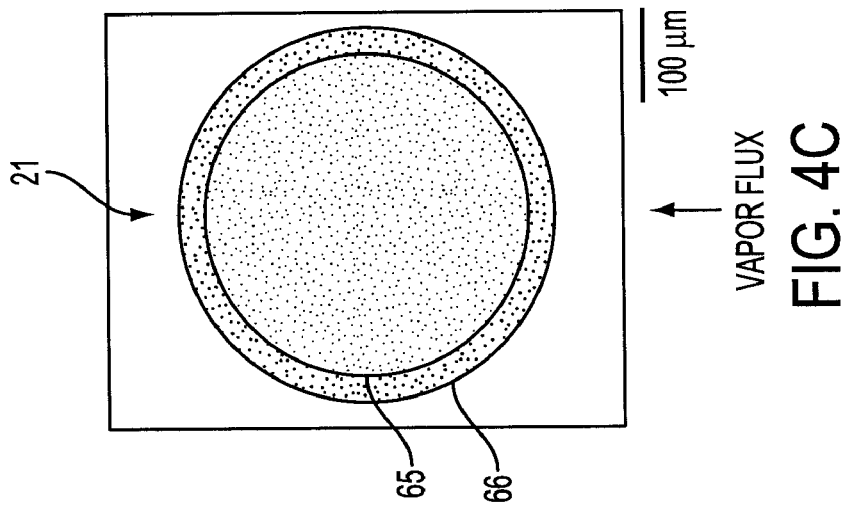

Accordingly, FIGS. 4(A)-(C) are SEM micrographic representations of the cross section of the stainless steel wires/fibers 65 with a coating 66. The cross section of aluminum coatings deposited onto stainless steel fiber substrates (380 μm diameter) for a pressure ratio of 7.0, 4.5, and 2.0 are respectively shown in FIGS. 4(A)-(C). In each case the micrographs are taken from the midpoint of the 13 cm wire. It can be observed the dramatic increase in the coating thickness on the backside or non-line of sight region 21 of the fibers as the pressure ratio is decrease.

Figure 5:
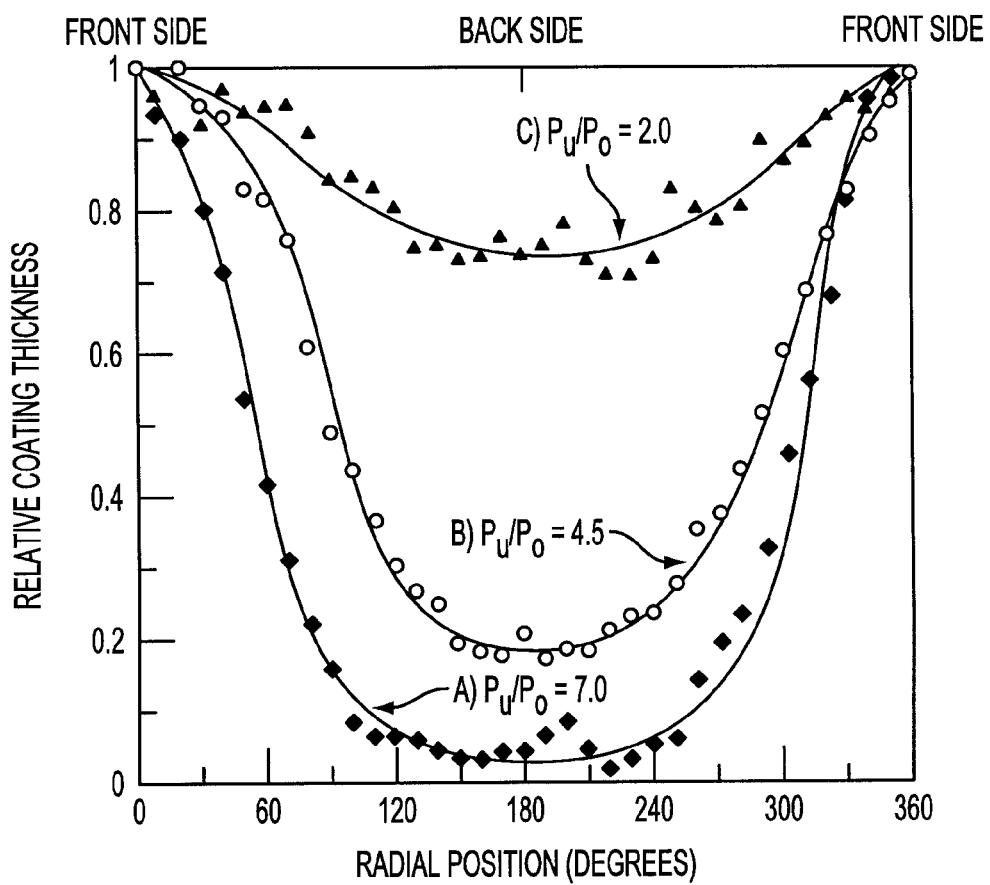
FIG. 5 is a graphical representation showing that the relative coatings thickness given as a function of the radial position on the wire, in particular pressure rations of 7.0, 4.5, and 2.0.

FIG. 5 is a graphical representation showing that the relative coatings thickness given as a function of the radial position on the wire. It can be observed that that for the case shown for FIG. 4(A), when the pressure ratio was high (i.e. 7.0) the uniformity of the coating is low as the backside coating thickness was less than 10% of the frontside. For the case shown for FIG. 4(B), when the pressure ratio was reduced to 4.5 the backside coating thickness increased. At the lowest pressure ratio (2.0), as for the case shown for FIG. 4(C), the backside coating thickness dramatically increased to greater than 70% of the frontside thickness. The overall thickness of the coatings on the frontside was also reduced (from 87 to 31 μm) when the pressure ratio was decreased from 7.0 to 2.0.

Regarding the DSMS, a DSMC code (Icarus) developed by Sandia National Laboratories was used to determine the velocity of the carrier gas for each of the three conditions and the interaction between the carrier gas/vapor flux and a polygonal cylinder (280 μm diameter) [25,26]. A reactor scale model was used to first simulate the expansion of a helium carrier gas from a choked nozzle in the absence of a cylindrical substrate. The flow field was determined at the substrate location and used in a second model to analyze the interaction of the flow with a cylindrical substrate. The inputs to the fiber interaction model were the velocity of the gas flow and the vapor flux at the position of the cylinder.

Figures 6A, 6B:
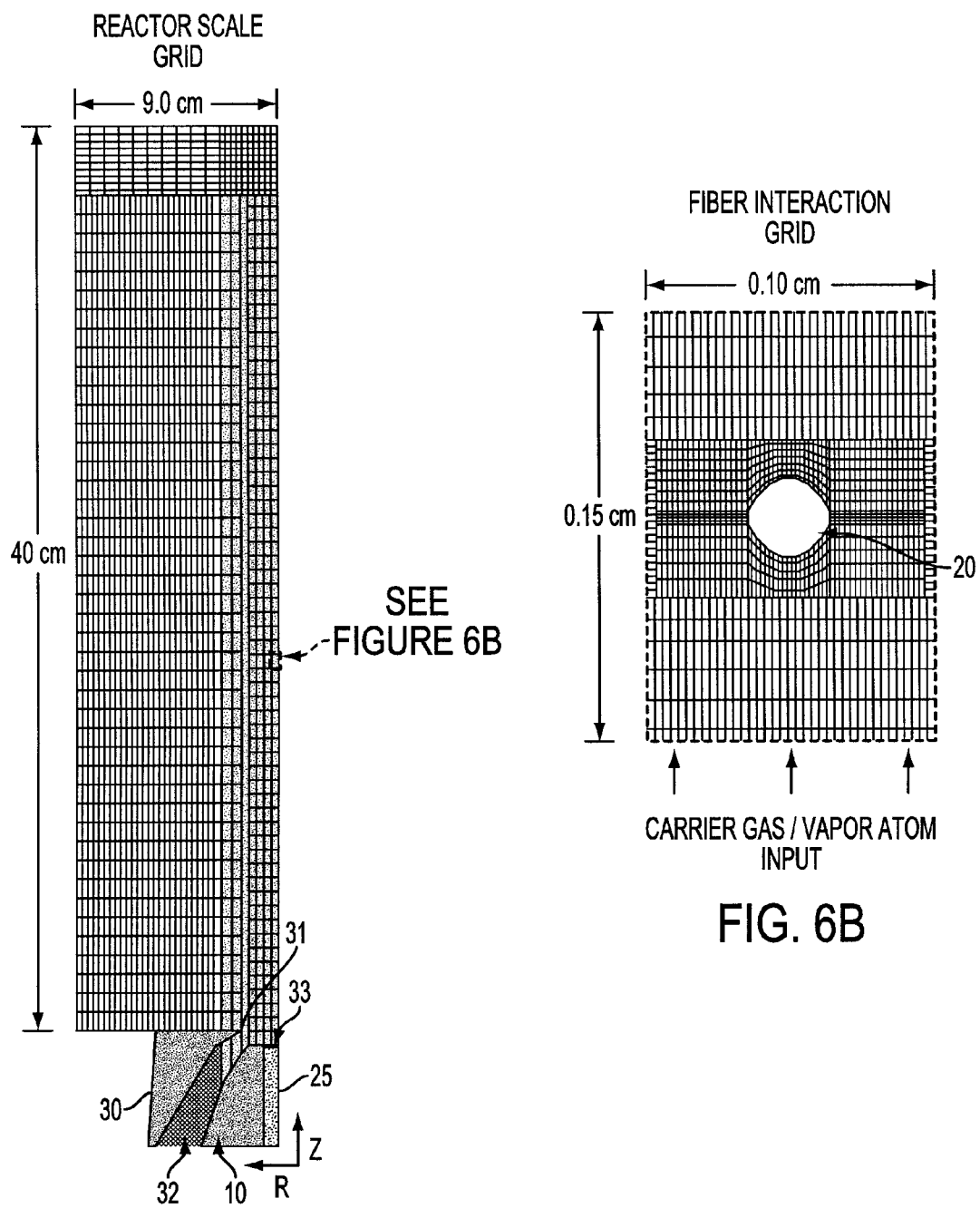
FIGS. 6(A)-(B) show direct simulation Monte Carlo (DSMC) simulations, which demonstrate the geometry of the reactor scale model (FIG. 6(A)) and the geometry of the fiber interaction model is given (FIG. 6(B)).

Turning to FIGS. 6(A)-(B), to accomplish this, the problem geometry, boundary conditions and collision properties were set to simulate a DVD processing environment [27]. As shown in FIG. 6(A), the geometry of the reactor scale model is shown. Next, as shown in FIG. 6(B), a second DSMC grid was setup for simulating the flow around a fiber. In both cases the simulated area was arbitrarily divided into regions which were subdivided into cells. The cell size was chosen to be small enough to capture the gradients in pressure, speed and temperature that existed in the flow field [28,29]. The nozzle opening 31 for all cases was 30 mm and adjacent thereto is the vapor inlet 33. A helium flow rate was input at a point upstream of the nozzle opening 31. By altering this flow rate the pressure upstream of the nozzle 30 was controlled. The chamber pressure was then maintained at a prescribed set point so that the proper pressure ratio and chamber pressure could be maintained. The number of particles simulated in each case was adjusted so that a minimum of 20 particles/cell were present in all cells. A time step of $1.0e^{-7}$ seconds was used. This value was chosen so that particles did not travel further than their mean free path during a time step. A variable hard sphere (VHS) model was used to determine scattering angles of collision events [28]. The VHS parameters used for the helium were $0.233e^{-9}$ m (reference temperature=300° K) for the molecular diameter and 0.66 for the viscosity index. The aluminum values were estimated based on an approach proposed by Fan [30]. A value of $1.0182e^{-9}$ m (reference temperature=300° K) was used for the molecular diameter. The viscosity index was taken to be the same that of helium.

Figure 7C:
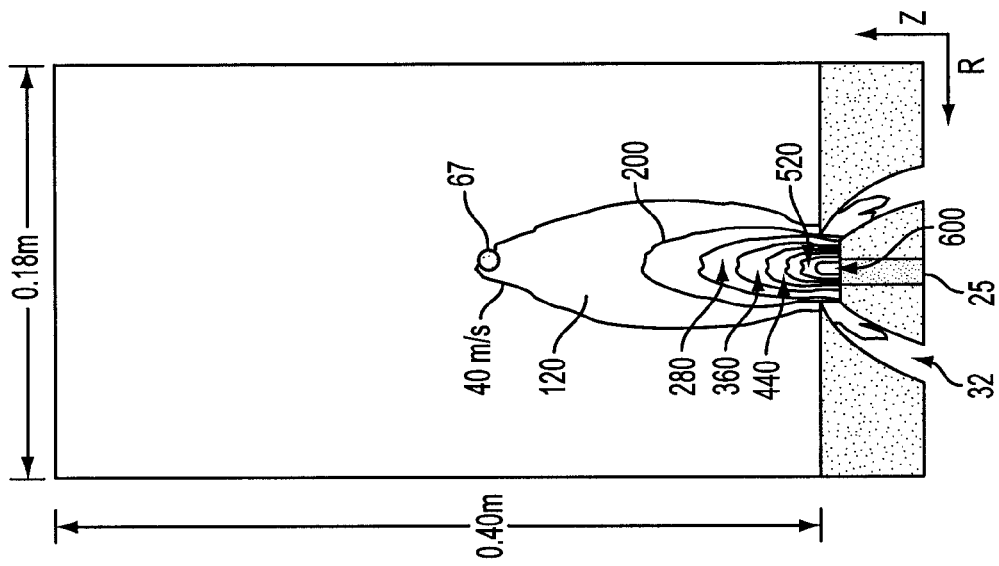
FIGS. 7(A)-(C) show axisymmetric direct simulation Monte Carlo (DSMC) simulations, which demonstrate the helium velocity in the Z-direction for a pressure ratio of 7.0, 4.5 and 2.0, respectively.
Figure 7B:
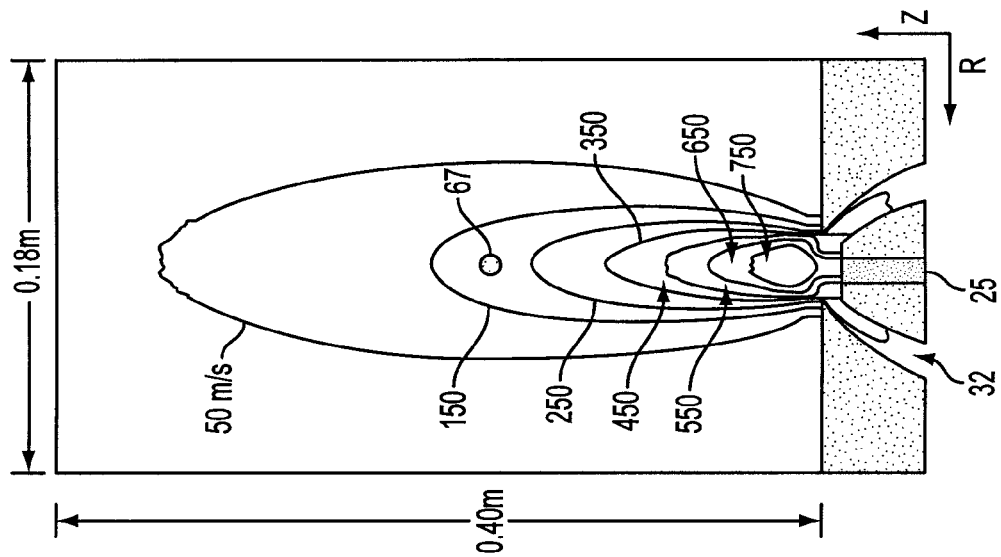
Figure 7A:
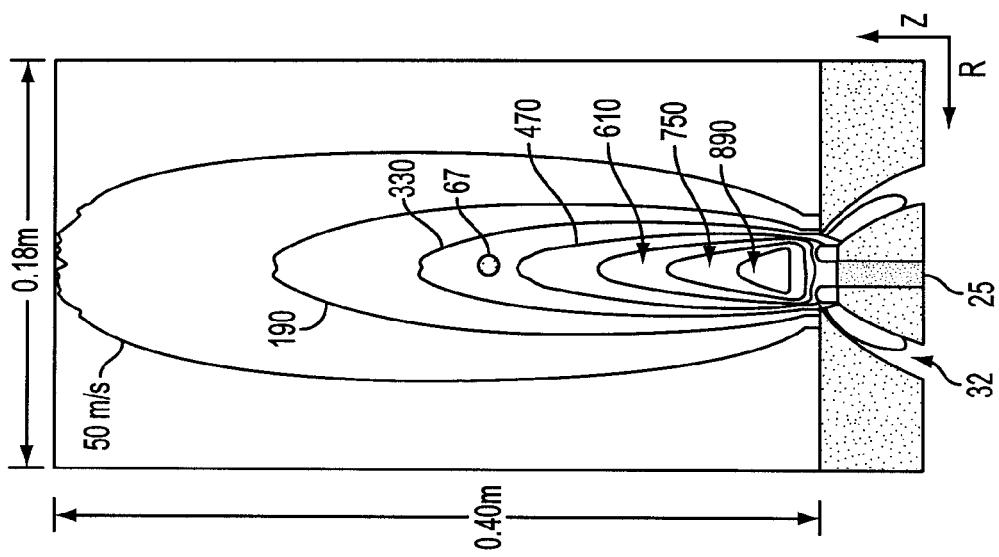

Regarding the simulation results, the effect of altering the pressure ratio on the properties of the carrier gas flow are schematically shown in FIGS. 7(A)-(C). Results for the Z-direction velocity of the helium carrier gas are plotted for the three pressure ratio conditions (7.0, 4.5 and 2.0) that were experimentally investigated, as illustrated in FIGS. 7(A)-(C), respectively. Note that the carrier gas velocity in the region of the flow where the gas would have impinged upon the fiber/wire (i.e., 15 cm from the source to the fiber/wire position 67) steadily increased with pressure ratio.

To investigate the effect of the carrier gas velocity on the uniformity of coating around a cylindrical wire the fiber interaction model was employed. The carrier gas velocities determined from the reactor scale simulations were used as inputs to this model. Aluminum vapor atoms were also input at the same velocity as the helium. The average helium trajectory and the helium velocity in the z-direction were determined in the region near the cylindrical substrate.

Figure 8B:
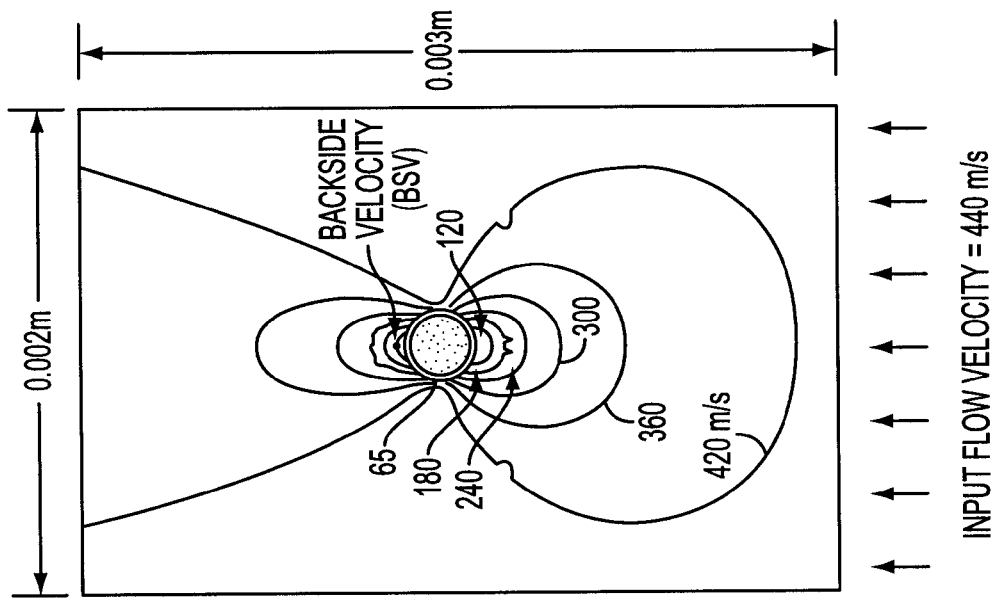
FIGS. 8(A)-(B) show DSMC simulations of the average trajectories of helium carrier gas atoms (streamlines) around a cylindrical substrate and the carrier gas velocity in the z-direction, respectively, for a 440 m/s carrier gas flow and a 16 Pa chamber pressure.
Figure 8A:
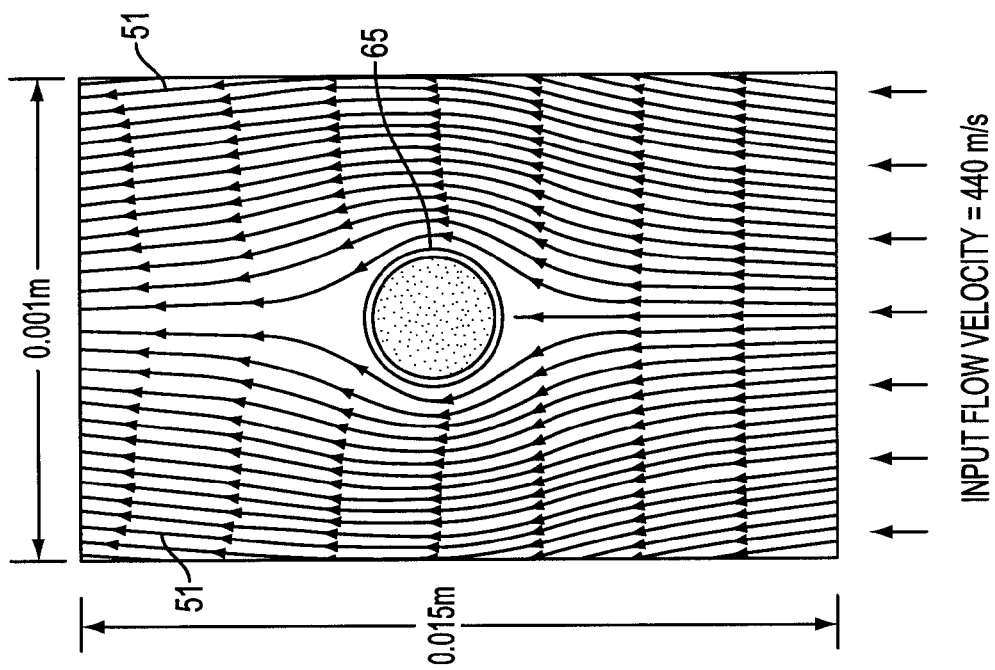

The average aluminum trajectories and the aluminum vapor density along the fiber surface were also determined. The average helium trajectories and the helium velocity in the z-direction are schematically shown in FIGS. 8(A)-(B), respectively, for the high velocity case (i.e. 440 m/s) and a 16 Pa chamber pressure. As shown in FIG. 8(A), the helium carrier gas flows around the fiber in a laminar manner in the stream lines 55. As shown in FIG. 8(B), the z-direction velocity of the helium is reduced near the substrate 65. The velocity at a point directly behind and 30 μm away from the substrate surface (i.e. the backside velocity (BSV)) was also recorded. Note in Table I that this velocity is substantial for the high velocity case and decreased with the background velocity to near zero for the low velocity case.

TABLE I

| Pressure Ratio | Flow Velocity (m/s) | Backside Velocity (m/s) | FSC Width (μM) | VIW (μM) | % FSC |
|---|---|---|---|---|---|
| 7.0 | 440 | 84.1 | 123 | 140 | 87.8 |
| 4.5 | 220 | 35.24 | 220 | 305.8 | 71.9 |
| 2.0 | 40 | 8.85 | 506 | 870 | 58.1 |

Figure 9C:
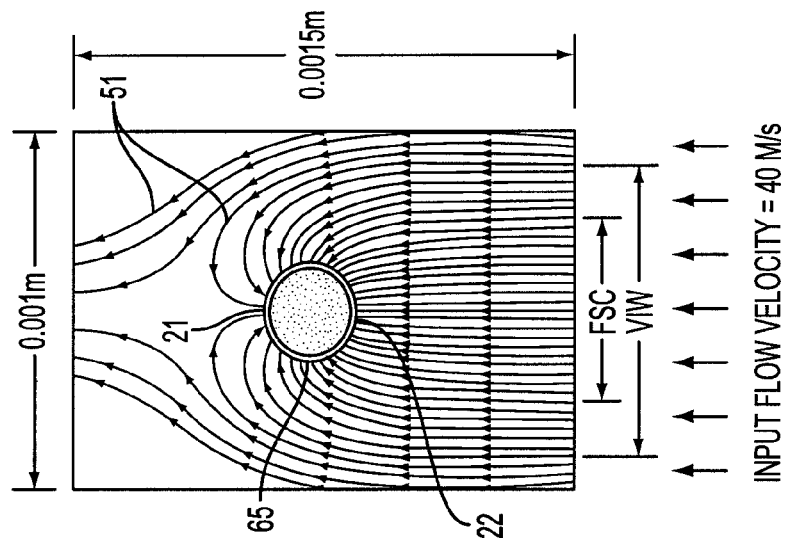
FIGS. 9(A)-(C) show the DSMC simulations of the average aluminum trajectories of aluminum vapor atoms around a fiber for the three flow velocities (440, 200, and 30 m/s), respectively, and pressure ratios, 7.0, 4.5 and 2.0, respectively at 16 Pa chamber pressure.
Figure 9B:
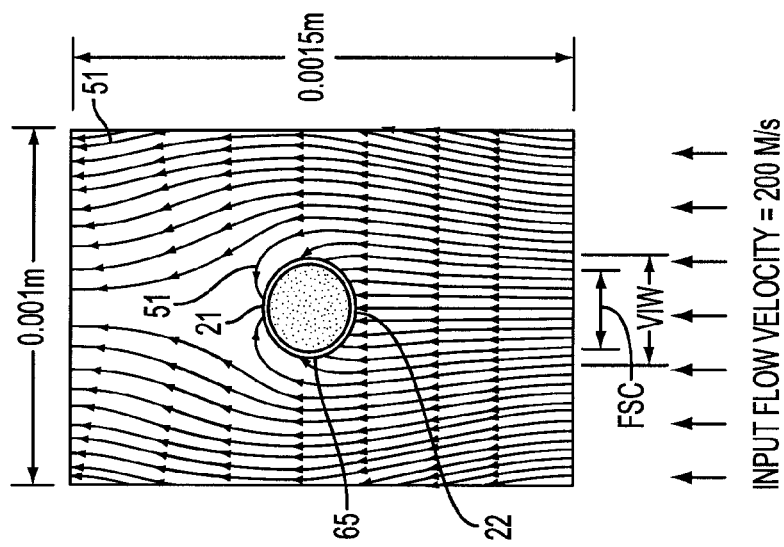
Figure 9A:
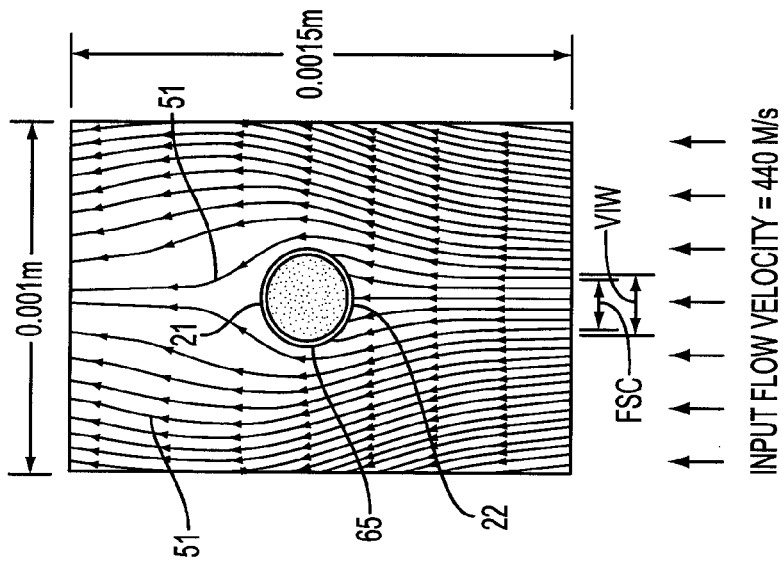

FIGS. 9(A)-(C) show the DSMC simulations of the average trajectories of aluminum vapor within the stream lines 51 around a fiber 65 for the three flow velocities (440, 200, and 30 m/s), respectively. As shown in FIG. 9(A), at a helium flow velocity of 440 m/s the aluminum trajectories are similar to those of the helium as they flow within the streamlines 51. In this case, the aluminum flows around the substrate in a laminar manner. As the flow velocity was decreased a significant deviation between the aluminum and helium trajectories were observed. For instance, referring to FIG. 9(C), at a flow velocity of 40 m/s aluminum atoms are observed to deposit on both the front side 22 and the back side 21 of the substrate or fiber 65. Note that the aluminum atoms from a larger area of the vapor than the high velocity case can deposit onto the substrate or fiber 65 (see Table I). For streamlines which originate 920 μm upstream of the substrate the aluminum trajectories have a vapor impact width (VIW) can be defined as the width of the vapor flux which impacted onto some area of the substrate. The vapor width whose atoms impinged upon the substrate on the frontside was also determined as the front side coating width (FSC). It can be observed that in the high velocity case (FIG. 9A) the VIW was less than the wire diameter, d (approximately 0.5 d). However, when the velocity was reduced (FIG. 9B) a VIW much larger than d (approximately 3.1 d) was observed. The percentage of atoms which deposited on the backside of the coating also increased as the velocity decreased.

Figure 10:
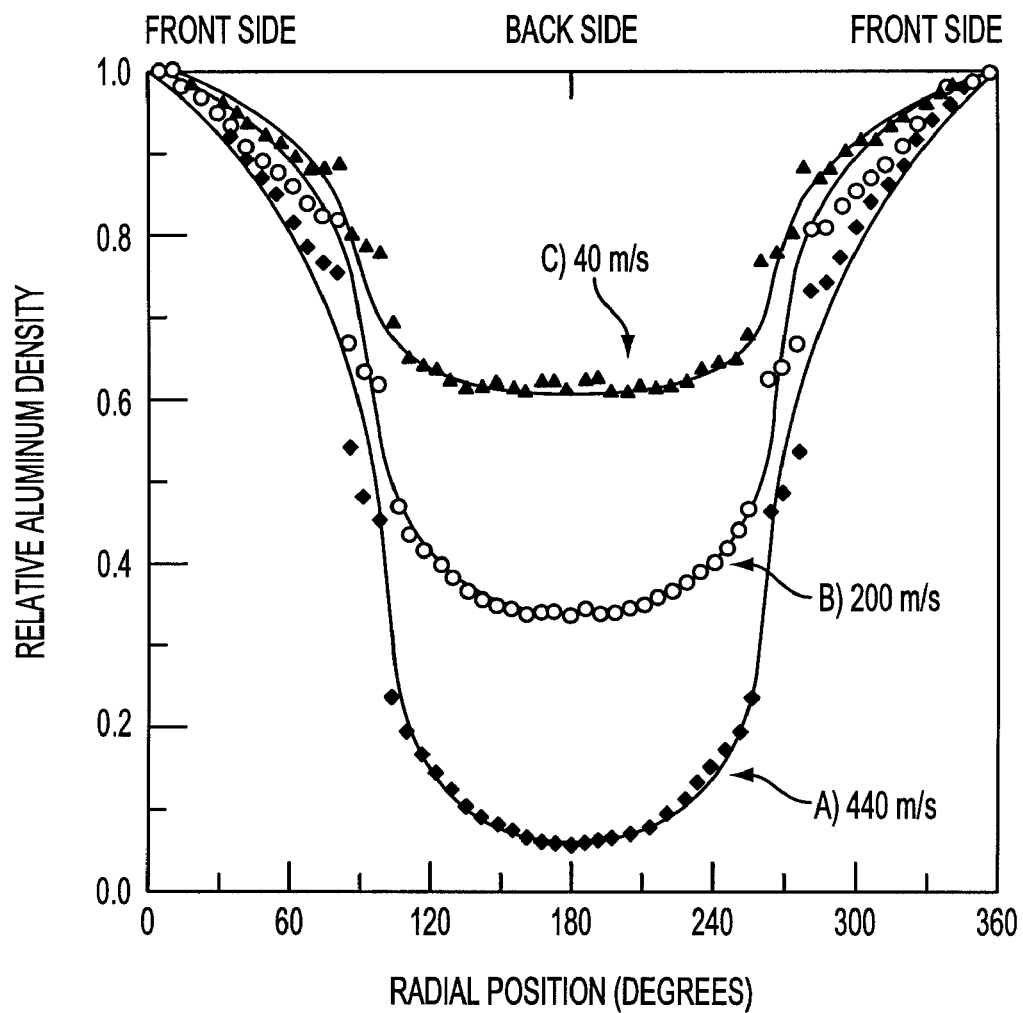
FIG. 10 is a graphical representation showing the relative aluminum density above the fiber surface as a function of radial position on the fiber for a carrier gas/vapor atom velocity of 440 m/s, 200 m/s and 40 m/s.
Figure 11:
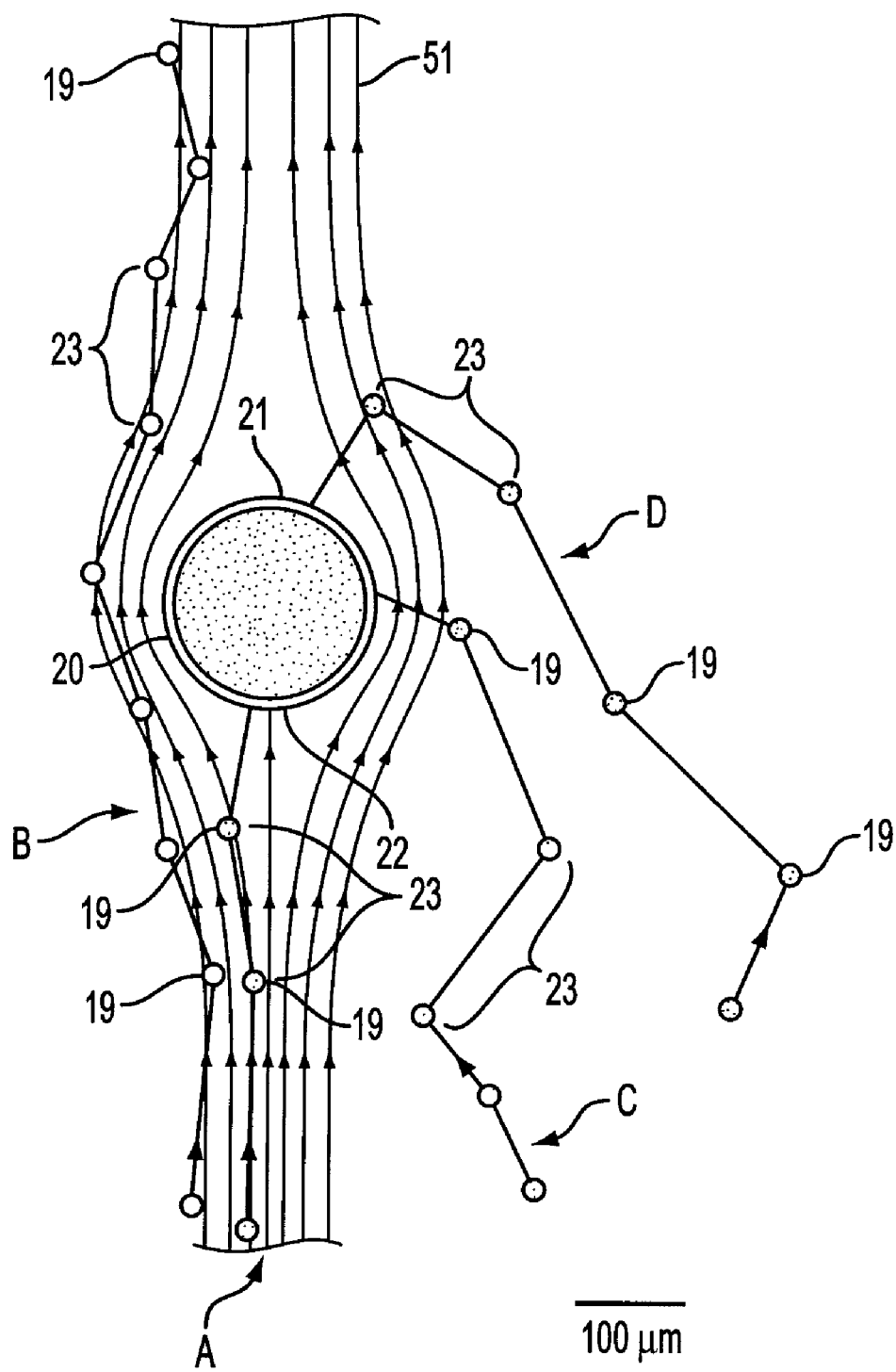
FIG. 11 is a schematic illustration of a possible vapor atom path near a cylindrical substrate in the presence of a carrier gas flow wherein: 1) a vapor atom with high momentum deposits on the front side of the substrate as the carrier gas is unable to alter to trajectory along with the flow (path A); 2) the case of a vapor atom directed around the fiber by the carrier gas is shown and no deposition occurs (path B); 3) a vapor atom laterally diffuses onto the side of the substrate resulting in non-LOS coating (path C); and 4) a vapor atom deposits on the backside of the substrate by scattering out of the carrier gas streamline against the flow direction (path D).
Figure 12A:
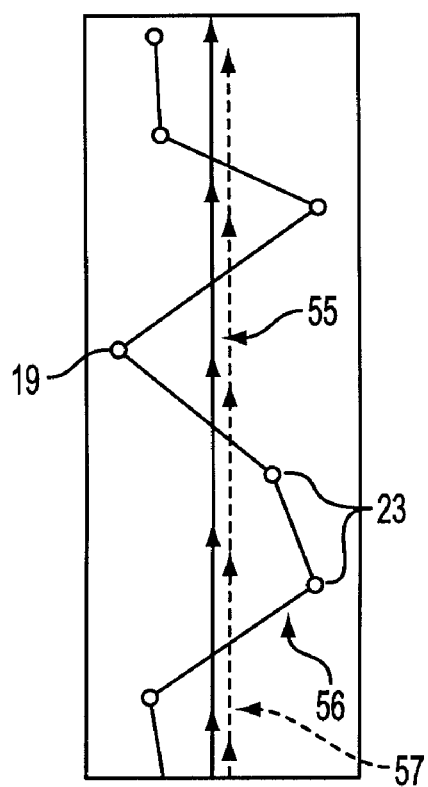
FIGS. 12(A)-(B) schematically illustrate the random walk of a vapor atom in the presence of a carrier gas without a surface present, FIG. 12(A), and with a surface present, FIG. 12(B).
Figure 12B:
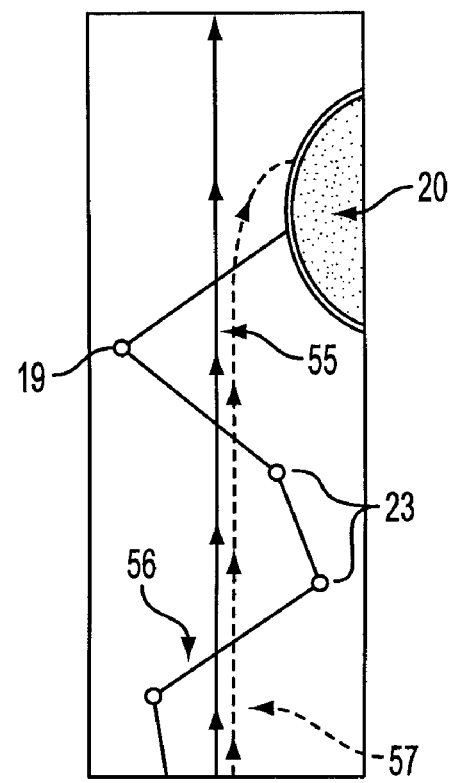

FIG. 10 is a graphical representation of the computed aluminum vapor density a distance 10 μm from the surface of the cylindrical substrate as a function of the radial position on the substrate/fiber for a carrier gas/vapor atom velocity of 440 m/s, 200 m/s and 40 m/s. There is shown that as the flow velocity is decreased the uniformity of the aluminum density around the fiber is improved.

This Example illustrates that, among other things, the use of a carrier gas flow to entrain vapor atoms allowed for the coating of regions on a substrate that were not line-of-sight (NLOS) or back side. The degree of non line-of-sight (NLOS) coating and thus, the thickness uniformity around the substrate was a sensitive function of the flow conditions. For a fixed background pressure in the region of deposition an increase in the uniformity of the coating thickness was observed as the flow velocity was reduced. The improvement in uniformity is a result of an increase in the fraction of vapor atoms which deposit in NLOS positions on the substrate.

NLOS coating results from binary collisions between carrier gas and vapor atoms in the flow. It occurs when vapor atoms are carried in a streamline near a substrate by the carrier gas. The streamlines of the carrier gas do not intersect with the NLOS positions on the substrate (see FIG. 8A), however, scattering from the carrier gas streamlines allows the vapor atoms to diffuse out of the flow and impact parts of the substrate that are not directly viewable from the source. Thus, the flow conditions which control whether vapor atoms precisely follow the carrier gas streamlines or scatter in and out of the streamlines will determine the uniformity of the coating thickness.

The transport of vapor atoms in a carrier gas depends on several factors: 1) the velocity (or kinetic energy) of the carrier gas and the vapor atom, 2) the carrier gas atom/vapor atom mean free path (which defines the collision frequency between the two atom types) and 3) the mass of the atoms present. High carrier gas velocities and short mean free paths will promote a close match between the vapor atom/carrier gas trajectories.

The mass difference between the vapor atom and the carrier gas is also critical as it determines the collision frequency and carrier gas kinetic energy required to alter the vapor atom trajectory. This is particularly important in regions of the flow where sudden changes occur in the trajectories of the carrier gas (i.e. in the region near a cylindrical substrate). In this Example, the atomic masses of the carrier gas and the vapor atom were $0.6650e^{-26}$ kg (helium) and $0.4458e^{-25}$ kg (aluminum), respectively. Thus, since the velocity of each atom type was approximately the same, the aluminum had more momentum. Thus, referring to FIG. 11, this momentum reduced its ability to follow the carrier gas trajectories near the substrate 20 and promoted LOS deposition, as shown by path designated as A. However, even for the high velocity case the aluminum momentum was not enough to limit some of the vapor from being carried with the helium around the wire substrate 20, as shown by path B. This was evidenced by the simulation observation that the VIW was less than the wire diameter in this case.

Still referring to FIG. 11, when the carrier gas velocity is reduced and/or the mean free path is increased collisions between the carrier gas and the vapor atoms occur less frequently and the kinetic energy of the carrier gas is lowered. The ability of the carrier gas to alter the vapor atom trajectory is then reduced. As a result, the vapor atoms develop an increasing random walk aspect to their motion which results in a migration radial to the gas flow streamline, as shown in paths C and D. When this occurs near the substrate surface the radial migration allows vapor atoms to deposit onto all areas of the substrate 20. Thus, the average vapor atom trajectories are found to angle towards the substrate in this region, see FIG. 12 (to be discussed later).

During operation, an energetic beam 3 impinges an evaporant source 25 in a chamber 4 to generate an evaporated vapor flux 15 comprised of evaporant molecules 17, as generally shown in FIG. 3. At least a portion of the generated evaporated vapor flux is deflected by the carrier gas streams lines 51 (as shown in FIG. 11), comprised of carrier gas molecules (not shown). Turning to FIG. 11, the evaporant molecules (not shown) entrained within those stream lines 51 have a given flow velocity, $v_f$. To allow the evaporated vapor flux to at least partially coat the NLOS portion 21 of the substrate 20, the flow velocity, $v_f$, allows the scattering time interval, t, of the evaporant molecules and gas molecules to be less than the time the evaporant molecules are within the mean free path (λ) 23, of the vicinity or proximity of the non-line of sight region 21 or vicinity/proximity of the substrate 20 to be coated. The scattering time interval, t, being defined as the time between collisions of the evaporant molecules and the carrier gas molecules (such collisions of the carrier gas molecules and vapor atoms being schematically represented by reference number 19). The mean free path (λ) 23 is defined as the path segment between successive collisions between a carrier gas molecule and an evaporant molecule; such collisions are as shown by reference numbers 19.

FIGS. 12(A)-(B) schematically illustrate the random walk 56 of a vapor atom in the presence of a carrier gas without a surface of a substrate 20 present, FIG. 12(A), and with a surface of a substrate 20 present, FIG. 12(B). Also shown are the average gas jet trajectories 55 and average vapor atom trajectories 57.

Such diffusion creates a mechanism for a greatly increased area of the vapor flux to deposit onto a fiber or wire which occupies a given area of the flux. Results here (see for example FIG. 9C) indicate a greater than 300% improvements in the VIW over LOS coating processes when the flow velocity was reduced. The FSC width was also increased in this case due to the vapor atom migration.

The reduction of the carrier gas velocity at a constant chamber pressure also results in a decrease in the density of the vapor flux which impacts a given point on the wire substrate. The decreased density occurs because the carrier gas is less able to focus the expanding vapor flux as its leaves the source. This reduced density results in a lower front side coating thickness for a pressure ratio of 2.0 with respect to a ratio of 7.0.

Even when the carrier gas velocity/mean free path are such that significant vapor atom radial diffusion occurs, NLOS coating onto the backside is still dependent on the flow velocity in a second way. Backside coating can be reduced by the z-direction velocity component of the carrier gas which flows into the front side and away from the back side. Although this velocity is reduced near the substrate a significant z component exists when the flow velocity is high (see Table I). Since "lateral" diffusion on the back side of the cylinder must now occur opposite the flow direction and not laterally deposition onto the backside will be reduced to some extent by this effect.

Example No. 2

FIG. 15 depicts an exemplary embodiment of the present invention apparatus in operation. In the exemplified DVD apparatus 1, material 25 is vaporized using an energetic beam 3. The vapor flux 15 is focused by a carrier gas 5 and directed into a substrate 20 (i.e., object, target or region thereof), such as wire or fiber 65. A feeder spool 127 or the like advances the wire or fiber 65 (such as an array, mesh, or mat) so as to receive a first pass 124 and a second pass 129 of coating(s) before being taken up by the take up spool 128 or the like.

Turning to FIGS. 16(A)-(B), FIG. 16(A) schematically illustrates a desired coating 66 at the LOS region 22 and NLOS region 21 deposited on the fiber wire 65 on a first pass. Additionally, FIG. 16(B) schematically illustrates a desired coating 122 at the LOS region 122 and the NLOS region 121 deposited on the fiber wire 65 on a second pass.

Example No. 3

FIG. 20 depicts an exemplary embodiment of the present invention apparatus in operation. In the exemplified DVD apparatus 1, material 25 is vaporized using an energetic beam 3. The vapor flux 15 is focused by a carrier gas 5 and directed into a substrate 20 (i.e., object, target or region thereof), wherein the substrate 20 is at least substantially parallel with the general flow of the carrier gas 5. It should be appreciated that the angle or alignment can be adjusted as desired.

In conclusion, the present invention provides an improved method and apparatus for applying a coating to a substrate using an energetic beam-directed vapor deposition (EB-DVD) having numerous advantages as discussed supra and infra, but not limited thereto. The present invention method and apparatus improves material utilization efficiency of the deposition process.

Second, the present invention method and apparatus increases the deposition rate applied to LOS and NLOS regions for single and multilayer coatings.

In addition, the present invention method and apparatus improves the coating uniformity improved.

Further, the present invention method and apparatus allows the ratio of carrier gas flow to vapor molecular concentration to be dramatically reduced while increasing the material utilization efficiency of the technology.

Further yet, the present invention method and apparatus coats an object or substrate in a manner to eliminate or minimize the use of complicated translation and rotation systems.

Still further, the present invention method and apparatus can apply a uniform and conformal (non line-of-sight) coating on non-planar substrates including but no limited to: single fibers, fiber arrays (woven or non-woven), fiber bundles, wires, wire mesh structures, yarns, monofilaments, mats, microporous structures open cell reticulated foams, (stochastic or periodic) cellular structures, truss structures, perforated/punched/expanded metal grids, medical devices including stents, engineering design tools and instruments, and construction tools and instruments, etc.

Moreover, the present invention provides an apparatus and method for the application of a coating(s) to a substrate(s) that is required in a wide variety of engineering applications, including thermal or environmental protection, improved wear resistance, altered optical or electronic properties, decorative, biocompatibility, etc. In each of these cases, the present invention provides the ability to deposit compositionally controlled coatings efficiently, uniformly, at a high rate, with a high part throughput, and in a cost effective manner.

Finally, an aspect of the present invention is that it provides a method and an apparatus for efficiently applying a uniform and conformal (non line-of-sight) coating onto ligament shaped structures/surfaces using a directed vapor deposition (DVD) approach. Such an approach can be aimed at depositing metal coatings, as well as to semiconducting and ceramic coatings, or a combination of any of these in multilayers, whereby a wide variety of industrial applications can be achieved.

Accordingly, the present invention method and apparatus has significant positive economic implications for the utility of the process.

The present invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

REFERENCES

The references as cited throughout this document and below are hereby incorporated by reference in their entirety.
1. T. Suzuki and H. Umehara, Carbon, 37 (1999) 47.
2. P. R. Subramanian, S. Krishnamurthy, S. T. Mendiratta, Mat. Sci. and Eng., A244, (1998) 1.
3. T. Kaneko and O. Nittono, Surf. Coat. Tech., 90 (1997) 268.
4. F. Lantelme, A. Salmi, B. Coffin, J. Claverie and Y. Le Petitcorps, Mat. Sci. and Eng., B39 (1996) 202.
5. Z. Shi, X. Wang and Z. Ding, Applied Surface Science, 140 (1999) 106.
6. S. V. Sotirchos and S. F. Nitodas, J. Crystal Growth, 234 (2002) 569.
7. F. S. Shieu and M. H. Shiao, Thin Solid Films, 306 (1997) 124.
8. J. H. Miller, P. K. Liaw and J. D. Landes, Mat. Sci. and Eng., A317 (2001) 49.
9. K. A. Appiah, Z. L. Wang and W. J. Lackey, Carbon, 38 (1999).
10. T. J. Hwang, M. R. Hendrick, H. Shao, H. G. Homis and A. T. Hunt, Mat. Sci. and Eng., A244 (1998) 91.
11. A. R. Boccaccini, C. Kaya and K. K Chawla, Composites: Part A, 32 (2001) 997.
12. I. Zhitomorsky, J. European Ceramic Society, 18 (1998) 849.
13. I. Zhitomirsky and L. Gal-Or, Materials Letters, 38 (1999) 10.
14. S. Shingubara, H. Kotani, H. Sakaue, F. Nishiyama and T. Takahagi, J. Vac. Sci. Technol. B 17[6] 1999 2553.
15. D. T. Queheillat, D. D. Hass, D. J. Sypeck and H. N. G. Wadley, J. Mater. Research Soc., 16 (2001) 1028.
16. M. Amon, A. Bolz and M. Schaldach, J. of Mat. Sci: Materials in Medicine, 7 (1996) 273.
17. A. Bolz and M. Schaldach, Biomed. Technik, 37 (1992) 244.
18. R. F. Bunshah, Handbook of Deposition Technologies For Films and Coatings, Noyes Publications, New Jersey, 2nd edn. 1982.
19. EB-PVD S. Schiller, U. Heisig and S. Panzer, Electron Beam Technology, Verlag Technik, Berlin, Germany, 1 st edn. 1995.
20. D. A. Glocker, M. M. Romach and V. W. Lindberg, Surf. Coat. Technol., 146-147 (2001) 457.
21. S. Schiller, U. Heisig and S. Panzer, Electron Beam Technology, Verlag Technik, Berlin, Germany, 1 st edn. 1995.
22. J. F. Groves, H. N. G. Wadley, A. P. Ritenour, D. D. Hass and P. L. Ratnaparkhi, P. L., *Proceedings of Electron Beam Melting and Refining State of the Art*, Bakish Materials Corp., Englewood, N.J., 1997, p. 46.
23. J. F. Groves and H. N. G. Wadley, Composites B, 28B (1997) 57.
24. D. D. Hass, P. A. Parrish and H. N. G. Wadley, J. Vac. Sci. Technol., A 16[6] (1998) 339.25. T. J. Bartel and S. J. Plimpton. AIAA 92-2860 (1992).
26. T. J. Bartel et. al., AIAA 94-2047 (1994).
27. D. D. Hass, Ph.D. Dissertation, University of Virginia (2001).
28. G. A. Bird, Molecular Gas Dynamics and the Direct Simulation of Gas Flows, Clarendon Press, Oxford, 1994.
29. F. J. Alexander, A. L. Garcia and B. J. Alder, *Phys. of Fluids,* 10[6] (1998) 1540.
30. J. Fan, I. D. Boyd and C. Sheiton, J. vac. Sci. Technoi. AI8[6] (2000) 2937.

We claim:

1. A method for applying at least one coating on a substrate on at least a non-line of sight region of the substrate, comprising:

presenting said substrate to a chamber; said chamber having a down stream pressure, $P_c$, with an operating range from about $10^{-4}$ to about $10^3$ Torr;

presenting at least one evaporant source to said chamber;

presenting carrier gas streams comprised of gas molecules to said chamber, said carrier gas streams being defined by a pressure ratio that gives the carrier gas molecules a predetermined flow velocity, $V_f$;

impinging said evaporant source with at least one electron energetic beam in said chamber to generate an evaporated vapor flux comprised of evaporant molecules, wherein said evaporated vapor flux is directed by said carrier gas streams toward said substrate; and deflecting at least a portion of said generated evaporated vapor flux by said carrier gas streams, wherein the evaporant molecules have said predetermined flow velocity, $V_f$, and said evaporated vapor flux coats all surfaces of the substrate including an area facing opposite said evaporant source, wherein said predetermined flow velocity, $V_f$, allows the scattering time interval, t, of said evaporant molecules and gas molecules to be less than the time the evaporant molecules are within the mean free path, $\lambda$, in the proximity of the non-line of sight region of the substrate to be coated, said scattering time interval, t, being defined as the time between collisions of the evaporant molecules and the carrier gas molecules, and said mean free path, $\lambda$, being defined as the path segment between successive collisions between a carrier gas molecule and an evaporant molecule.

2. The method of claim 1, wherein said scattering time interval, t, is defined by the equation:

$$t = \frac{\lambda}{V_f}.$$

3. The method of claim 1, wherein said non-line-of sight coating is deposited on at least a circumferential portion of said substrate.

4. The method of claim 1, wherein said non-line-of sight coating is deposited on at least a perimeter portion of said substrate.

5. The method of claim 1, wherein said energetic beam comprises at least one of an electron beam source, a laser source, a heat source, an ion bombardment source, or a highly focused incoherent light source.

6. The method of claim 1, wherein said pressure ratio is defined by the equation:

$$\frac{P_u}{P_c}$$

$P_u$ is the upstream pressure of at least one nozzle that presents said at least one carrier gas streams to said chamber, and $P_c$ is the down stream pressure of said at least one chamber, wherein $P_c \geq 0.1$ Pa.

7. The method of claim 1, wherein said pressure ratio is between about 1,000 and 1.1.

8. The method of claim 1, wherein said pressure ratio is between about 6.0 and 1.1.

9. The method of claim 1, wherein said pressure ratio is between about 5.0 and 1.5.

10. The method of claim 1, wherein said pressure ratio is between about 4.5 and 2.0.

11. The method of claim 1, wherein said pressure ratio is about 2.

12. The method of claim 1, wherein said pressure ratio is about 1.1.

13. The method of claim 1, wherein said pressure ratio is about 10 and the distance between said substrate being coated and location of presenting said evaporant source is about 20 cm.

14. The method of claim 1, wherein said pressure ratio is about 2 and the distance between said substrate being coated and location of presenting said evaporant source is about 10 cm.

15. The method of claim 1, wherein said at least one substrate is substantially planar or planar.

16. The method of claim 1, wherein said at least one substrate is non-planar.

17. The method of claim 1, wherein said at least one substrate is made from the group consisting of single fibers, woven fiber arrays, non-woven fiber arrays, wires, wire mesh structures, yarns, monofilaments, open cell stochastic reticulated foams, open cell periodic reticulated foams, cellular structures, perforated grids, punched grids, and expanded grids.

18. The method of claim 1, wherein said at least one substrate is made from the group consisting of truss structures, woven mats, and fiber bundles.

19. The method of claim 1, wherein said at least one substrate is an engineering or a design tool or instrument, a construction tool or instrument, or a medical tool or instrument.

20. The method of claim 1, wherein said evaporant sources is selected material selected from the group consisting of metal, semiconductors, and ceramics.

21. The method of claim 20, wherein said metal material is elemental or multi-component alloys.

22. The method of claim 20, wherein said ceramic material is oxide or non-oxide.

23. The method of claim 1, wherein said at least partially coated substrate comprises multi-layered coating on said substrate.

24. The method of claim 1, wherein a plurality of said carrier gas streams comprise He.

25. The method of claim 1, wherein said carrier gas streams comprise He, $O_2$, $N_2$, hydrocarbons, silanes, and other inert gases, or combination of at least one of He, $O_2$, $N_2$, hydrocarbons, silanes, and other inert gases.

26. The method of claim 1, wherein said carrier gas streams consist of He.

* * * * *